United States Patent
Okano et al.

(10) Patent No.: US 7,516,376 B2
(45) Date of Patent: Apr. 7, 2009

(54) TEST PATTERN GENERATOR, TEST CIRCUIT TESTER, TEST PATTERN GENERATING METHOD, TEST CIRCUIT TESTING METHOD, AND COMPUTER PRODUCT

(75) Inventors: Osamu Okano, Kawasaki (JP); Hideaki Konishi, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 748 days.

(21) Appl. No.: 10/968,140

(22) Filed: Oct. 20, 2004

(65) Prior Publication Data

US 2005/0289419 A1 Dec. 29, 2005

(30) Foreign Application Priority Data

Jun. 29, 2004 (JP) ............................. 2004-192229

(51) Int. Cl.
*G01R 31/28* (2006.01)
(52) U.S. Cl. ........................... 714/726; 714/25; 714/30; 714/32; 714/703; 714/724; 714/727; 714/729; 714/733; 714/734; 714/818
(58) Field of Classification Search ....................... None
See application file for complete search history.

(56) References Cited

U.S. PATENT DOCUMENTS

| | | | | |
|---|---|---|---|---|
| 5,517,637 A * | 5/1996 | Bruce et al. | ..................... | 703/15 |
| 5,682,392 A * | 10/1997 | Raymond et al. | ........... | 714/727 |
| 5,717,700 A * | 2/1998 | Crouch et al. | ................ | 714/726 |
| 6,327,687 B1 * | 12/2001 | Rajski et al. | ................. | 714/738 |
| 6,408,424 B1 * | 6/2002 | Mukherjee et al. | .............. | 716/5 |
| 6,922,803 B2 * | 7/2005 | Nakao et al. | ................. | 714/738 |
| 6,996,791 B2 * | 2/2006 | Brunkhorst et al. | ............ | 716/4 |
| 7,099,783 B2 * | 8/2006 | Hasegawa et al. | .............. | 702/57 |
| 7,159,161 B2 * | 1/2007 | Lee et al. | ..................... | 714/738 |
| 2002/0124217 A1 * | 9/2002 | Hiraide et al. | ............... | 714/726 |
| 2003/0106004 A1 * | 6/2003 | Ricchetti et al. | ............ | 714/733 |
| 2007/0283202 A1 * | 12/2007 | Cheng et al. | ................. | 714/724 |

FOREIGN PATENT DOCUMENTS

JP 2002-236144 8/2002

OTHER PUBLICATIONS

Cheng et al., "Diagnosis for Wiring Interconnects", 1990, IEEE International Test Conference, Paper 27.2, pp. 565-571.*
IBM Technical Publication, NN9311621, "New Algorythm for Indentification of Interconnect Wiring Defects", Nov. 1, 1993, pp. 621-622.*

* cited by examiner

*Primary Examiner*—John P Trimmings
(74) *Attorney, Agent, or Firm*—Staas & Halsey LLP

(57) ABSTRACT

A test circuit tester includes a scan-chain input-output information generator that generates information for an input and an output of the scan chain that is scan-chain input-output information, based on input information for the scan chain; a test-circuit input-output information generator that generates information for an input and an output of the test circuit that is test-circuit input-output information, based on the scan-chain input-output information; an output unit that outputs the test-circuit input-output information generated; and a verifying unit that verifies the test circuit based on an output pattern output from the test circuit through the scan chains in response to input of the information for the input of the test circuit output to the test circuit, and the information for the output from the test circuit.

10 Claims, 21 Drawing Sheets

FIG.8

| TIME | INTERNAL INPUT-OUTPUT MATRICES | | | | EXTERNAL INPUT-OUTPUT MATRICES | | | | |
|---|---|---|---|---|---|---|---|---|---|
| | INTERNAL INPUT MATRIX | | INTERNAL OUTPUT MATRIX | | EXTERNAL INPUT MATRIX | | | | EXTERNAL OUTPUT MATRIX |
| | SI0 | SI1 | SO0 | SO1 | TDI | XMASK | SDI | | SDO |
| 0 | 0 | 0 | 0 | 0 | 0 | 0 | 0 | | 0 |
| 1 | 1 | 0 | 0 | 0 | 1 | 0 | 0 | | 0 |
| 2 | 0 | 0 | 0 | 0 | 0 | 0 | 0 | | 0 |
| 3 | 0 | 1 | 0 | 0 | 1 | 0 | 0 | | 0 |
| 4 | 0 | 0 | 1 | 0 | 0 | 0 | 1 | | 0 |
| 5 | 0 | 0 | 0 | 0 | 0 | 0 | 0 | | 1 |
| 6 | 0 | 0 | 0 | 0 | 0 | 0 | 0 | | 0 |
| 7 | 0 | 0 | 0 | 1 | 0 | 0 | 0 | | 0 |
| 8 | 0 | 0 | 0 | 0 | 0 | 0 | 0 | | 1 |
| 9 | 0 | 0 | 0 | 0 | 0 | 0 | 0 | | 0 |

FIG.10

| ID | CHAIN LENGTH (STAGES) |
|---|---|
| 0 | 189 |
| 1 | 45 |
| 2 | 87 |
| 3 | 90 |
| 4 | 10 |

FIG.20

CHAIN NUMBER (ID)

INTERNAL INPUT MATRIX $\begin{pmatrix} 0 & 10001 \\ 1 & 11000 \\ 2 & 01100 \\ 3 & 00110 \\ 4 & 00011 \end{pmatrix}$

TIME    012345

CHAIN NUMBER (ID)

INTERNAL OUTPUT MATRIX $\begin{pmatrix} 0 & 10001 \\ 1 & 11000 \\ 2 & 01100 \\ 3 & 00110 \\ 4 & 00011 \end{pmatrix}$

TEST PATTERN GENERATOR, TEST CIRCUIT TESTER, TEST PATTERN GENERATING METHOD, TEST CIRCUIT TESTING METHOD, AND COMPUTER PRODUCT

CROSS-REFERENCE TO RELATED APPLICATIONS

This application is based upon and claims the benefit of priority from the prior Japanese Patent Application No. 2004-192229, filed on Jun. 29, 2004, the entire contents of which are incorporated herein by reference.

BACKGROUND OF THE INVENTION

1) Field of the Invention

The present invention relates to a technology for generating a test pattern for testing a test circuit provided in an integrated circuit that includes a plurality of scan chains and the test circuit that tests the scan chains.

2) Description of the Related Art

Testing techniques for detecting manufacturing process defects of integrated circuits such as LSIs are known. For example, when a test pattern is verified using a logic simulator, parallel simulation of scan shifts based on normal operation of scan shift is generally performed.

Japanese Patent Application Laid Open Publication No. 2002-236144 discloses a conventional testing device and testing method for testing integrated circuits. The testing device includes a pattern generator that is incorporated in the integrated circuit and generates a test pattern, a plurality of shift registers formed with sequential circuits in the integrated circuit, and a pattern corrector that corrects the test pattern generated using input from the outside and inputs the test pattern corrected to the shift registers.

The conventional testing device and testing method allows a highly-accurate test to be executed in a short time. Moreover, the test can be executed without imposing severe limitations on design and without requiring any expensive tester.

However, if the parallel simulation of scan shifts is not performed in a current large scale integrated circuit, it is impossible to verify the test pattern during practical executing time.

In the conventional testing device and testing method, a scan data input terminal that is provided at an external terminal in a design stage of the conventional technology is not connected directly to an external pin, which causes an operation test of the scan shift not to be executed.

A test circuit includes a large number of gates as compared with those in a test circuit based on scanning technique, which causes possible failures to increase. On the other hand, an Automatic Test Pattern Generation (ATPG) program is used for generating test patterns for a target circuit to be tested, but is not used for generating test patterns for a test circuit itself that represents the testing device. Therefore, reliability of test is reduced. Moreover, a means to detect a failure of the test circuit is not present in the conventional technique.

SUMMARY OF THE INVENTION

It is an object of the present invention to solve at least the problems in the conventional technology.

A test pattern generator according to an aspect of the present invention is used in an integrated circuit. The integrated circuit includes a plurality of scan chains and a test circuit that tests the scan chains. The test pattern generator generates a test pattern for testing the test circuit. The test pattern generator includes an input unit that receives information for the scan chain; a scan-chain input-output information generator that generates information for an input and an output of the scan chain that is scan-chain input-output information, based on the information for the scan chain received; a test-circuit input-output information generator that generates information for an input and an output of the test circuit that is test-circuit input-output information, based on the scan-chain input-output information; and an output unit that outputs the test-circuit input-output information generated.

A test circuit tester according to another aspect of the present invention is used in an integrated circuit. The integrated circuit includes a plurality of scan chains and a test circuit that tests the scan chains. The test circuit tester tests the test circuit. The test circuit tester includes an input unit that receives information for the scan chain; a scan-chain input-output information generator that generates information for an input and an output of the scan chain that is scan-chain input-output information, based on the information for the scan chain received; a test-circuit input-output information generator that generates information for an input and an output of the test circuit that is test-circuit input-output information, based on the scan-chain input-output information; an output unit that outputs the test-circuit input-output information generated; and a verifying unit that verifies the test circuit based on an output pattern output from the test circuit through the scan chains in response to input of the information for the input of the test circuit output to the test circuit, and the information for the output from the test circuit.

A test pattern generating method according to still another aspect of the present invention is used in an integrated circuit. The integrated circuit includes a plurality of scan chains and a test circuit that tests the scan chains. The test pattern generator generates a test pattern for testing the test circuit. The test pattern generating method includes receiving information for the scan chain; generating information for an input and an output of the scan chain that is scan-chain input-output information, based on the information for the scan chain received; generating information for an input and an output of the test circuit that is test-circuit input-output information, based on the scan-chain input-output information; and outputting the test-circuit input-output information generated.

A test circuit testing method according to still another aspect of the present invention is used on an integrated circuit. The integrated circuit includes a plurality of scan chains and a test circuit that tests the scan chains. The test circuit tester tests the test circuit. The test circuit testing method includes receiving information for the scan chain; generating information for an input and an output of the scan chain that is scan-chain input-output information, based on the information for the scan chain received; generating information for an input and an output of the test circuit that is test-circuit input-output information, based on the scan-chain input-output information; and outputting the test-circuit input-output information generated; and verifying the test circuit based on an output pattern output from the test circuit through the scan chains in response to input of the information for the input of the test circuit output to the test circuit, and the information for the output from the test circuit.

A computer-readable recording medium according to still another aspect of the present invention stored a computer program that realizes on a computer the above test pattern generating method and the above test circuit testing method.

The other objects, features, and advantages of the present invention are specifically set forth in or will become apparent from the following detailed description of the invention when read in conjunction with the accompanying drawings.

BRIEF DESCRIPTION OF THE DRAWINGS

FIG. 8 is a graph of input-output matrices according to the embodiment;

FIG. 10 is a table containing "ID" and "Chain Length" according to the embodiment;

FIG. 20 is a schematic diagram for explaining internal input-output matrices for undefined masking unit.

DETAILED DESCRIPTION

Exemplary embodiments of a test pattern generator, a test circuit tester, a test pattern generating method, a test circuit testing method, and a computer product according to the present invention are explained in detail below with reference to the accompanying drawings.

Figure 1:
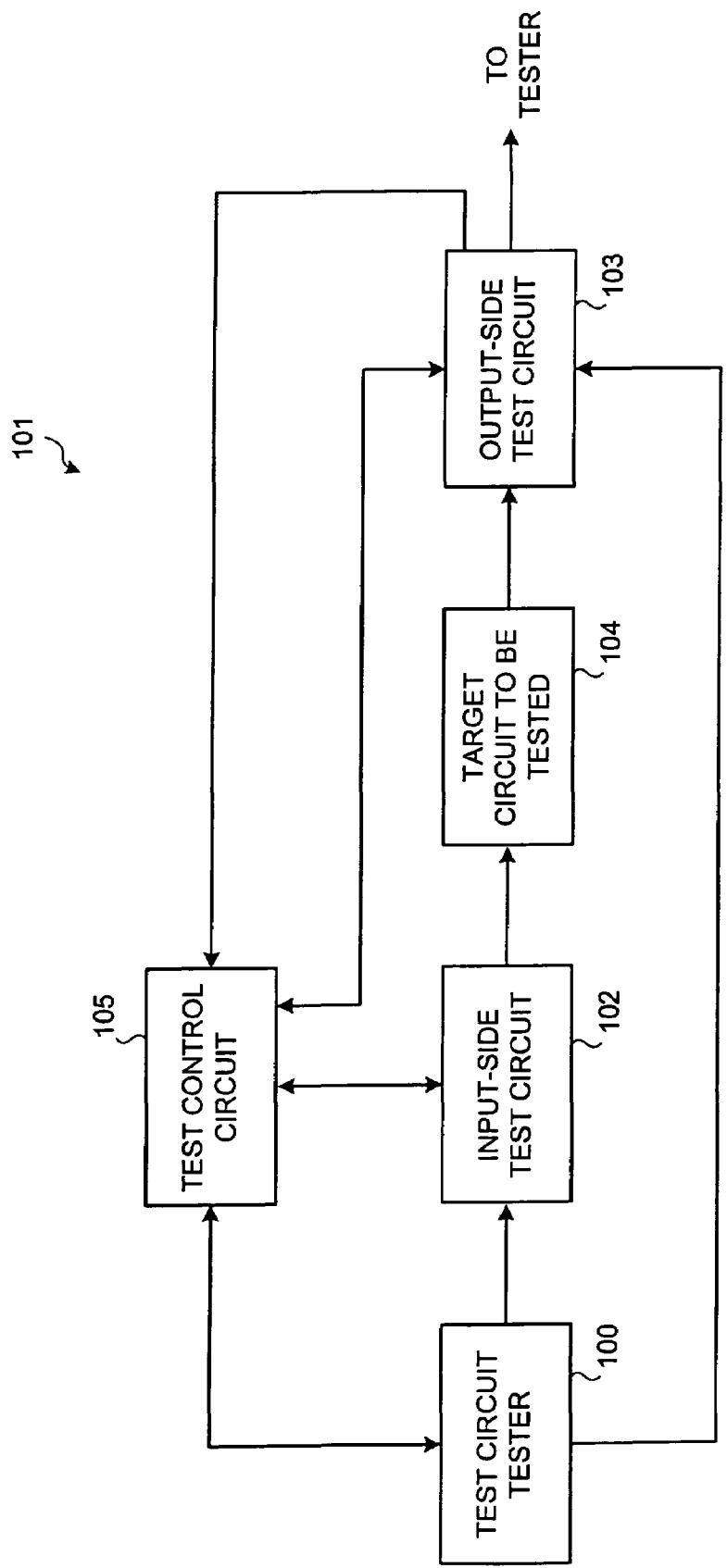
FIG. 1 is a block diagram of a test circuit tester according to an embodiment of the present invention.

FIG. 1 is a block diagram of a test circuit tester according to an embodiment of the present invention. A test circuit tester 100 tests a test circuit in an integrated circuit 101. The test circuit includes an input-side test circuit 102 and an output-side test circuit 103.

The integrated circuit 101 includes the test circuit (the input-side test circuit 102 and the output-side test circuit 103), a target circuit to be tested 104 (hereinafter, "target circuit 104"), and a test control circuit 105. The target circuit 104 realizes functions of a product to be mounted, and includes sequential circuits such as scan Flip-Flops (FFs). The target circuit 104 includes a plurality of scan chains that is formed with the sequential circuits as explained later.

The test circuit (the input-side test circuit 102 and the output-side test circuit 103) includes the sequential circuits and a combinational circuit, and tests the target circuit 104. The input-side test circuit 102 outputs a signal pattern to the target circuit 104, while the output-side test circuit 103 receives the signal pattern output from the target circuit 104. The test control circuit 105 includes a Test Access Port (TAP) controller, and controls the test circuit by a predetermined sequence.

Figure 2:
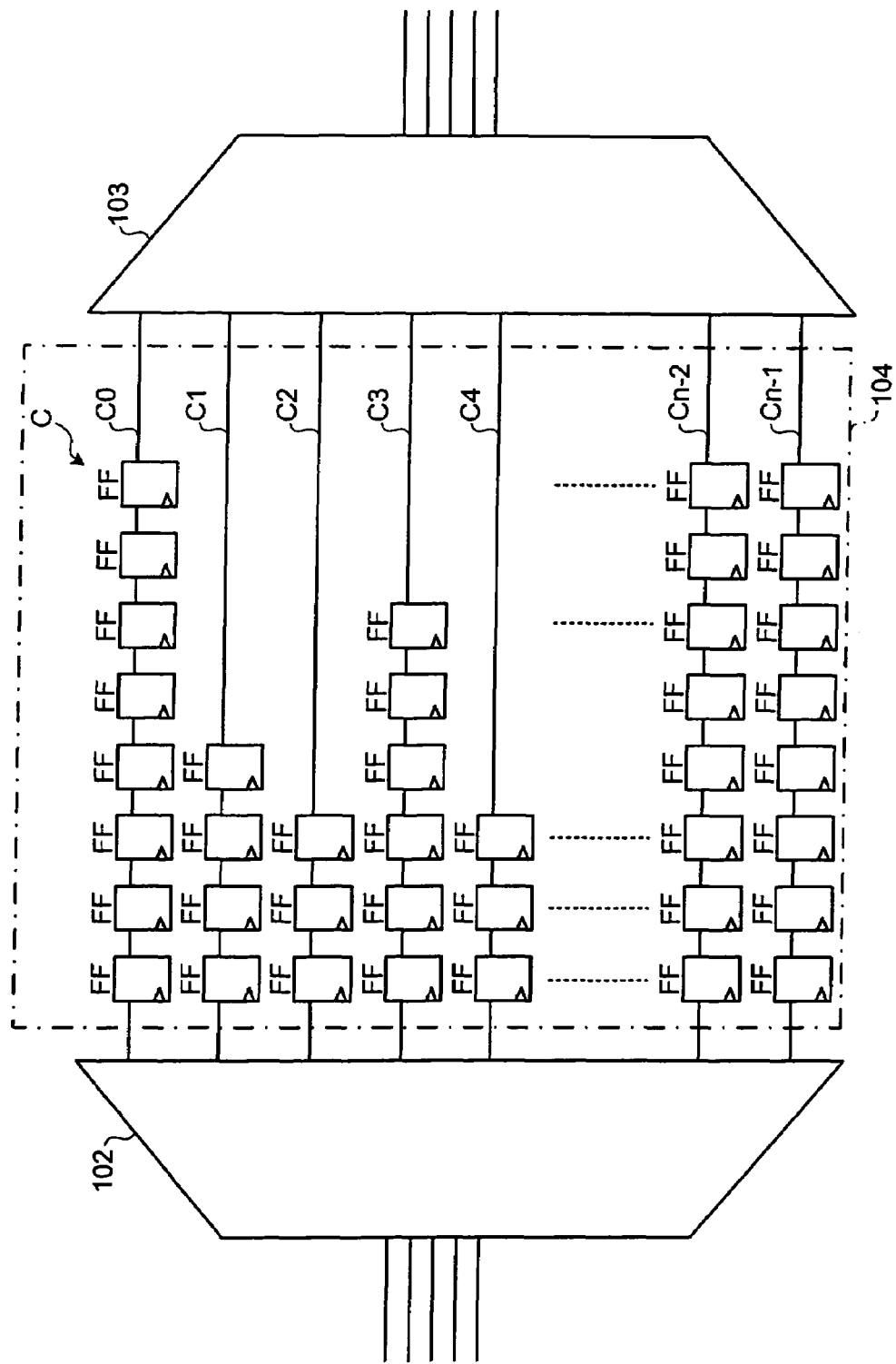
FIG. 2 is a schematic of a target circuit, that is a circuit that is to be tested, according to the embodiment.

FIG. 2 is a schematic of the target circuit 104 according to the embodiment. The target circuit 104 includes a plurality of scan chains C (n-lines in FIG. 2) that propagate data. The scan chains C are specified by scan chains C0, C1, ..., Cn-1, each of which is a shift register with a plurality of scan FFs linearly connected.

The number of scan FFs, i.e., the number of stages (or chain length) of the respective scan chains C0, C1, ..., Cn-1 is different from others. The number of scan chains C is larger than the number of test input pins of the input-side test circuit 102 or the number of test output pins of the output-side test circuit 103. For example, when the number of scan chains C is 256 lines, the number of test input (output) pins is about 10.

Figure 3:
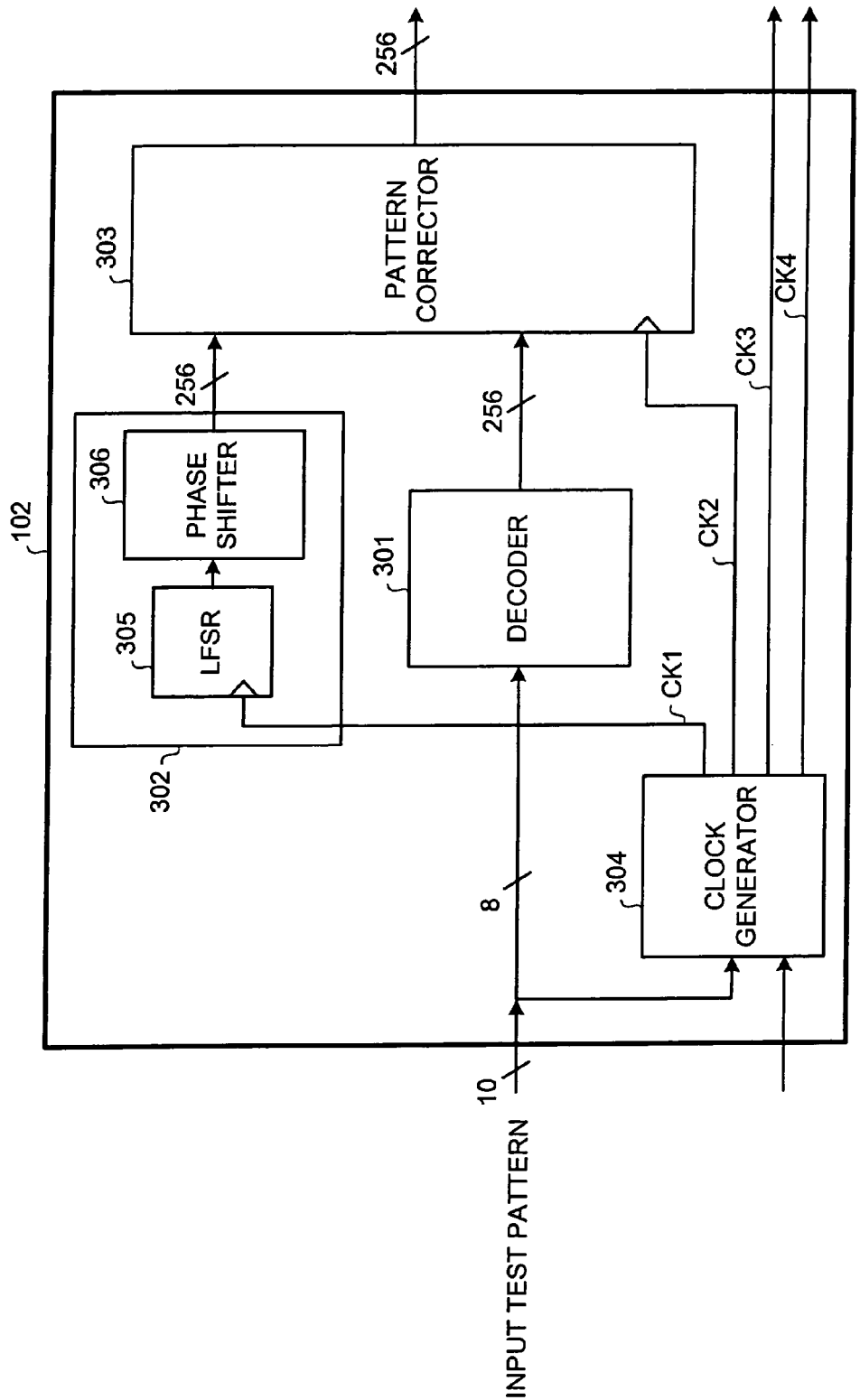
FIG. 3 is a block diagram of an input-side test circuit according to the embodiment.

FIG. 3 is a block diagram of the input-side test circuit 102. The input-side test circuit 102 is an input-side Automatic Test Generation/Built-In Self Test (ATGBIST) circuit. More specifically, the input-side test circuit 102 includes a decoder 301, a pattern generator 302, a pattern corrector 303, and a clock generator 304.

The decoder 301 decodes a test pattern output from a test pattern generator as explained later, and specifies a bit to be corrected in the pattern corrector 303 based on the result of decoding. The pattern generator 302 includes a Linear Feedback Shift Register (LFSR) 305 and a phase shifter 306. The LFSR 305 generates a pseudo random pattern in synchronization with a clock signal CK1 output from the clock generator 304, and outputs the pseudo random pattern to the pattern corrector 303 through the phase shifter 306.

The pattern corrector 303 corrects the bit specified in the pseudo random pattern generated by the pattern generator 302, based on the result of decoding by the decoder 301. The pseudo random pattern corrected is output to the scan chain C. The clock generator 304 generates the clock signal CK1 for the LFSR, a clock signal CK2 for the pattern corrector, a clock signal CK3 for an undefined masking unit, and a clock signal CK4 for an output verifier, and outputs the clock signals to the LFSR 305, an undefined masking unit 402 (see FIG. 4), and an output verifier 403 (see FIG. 4), respectively.

Figure 4:
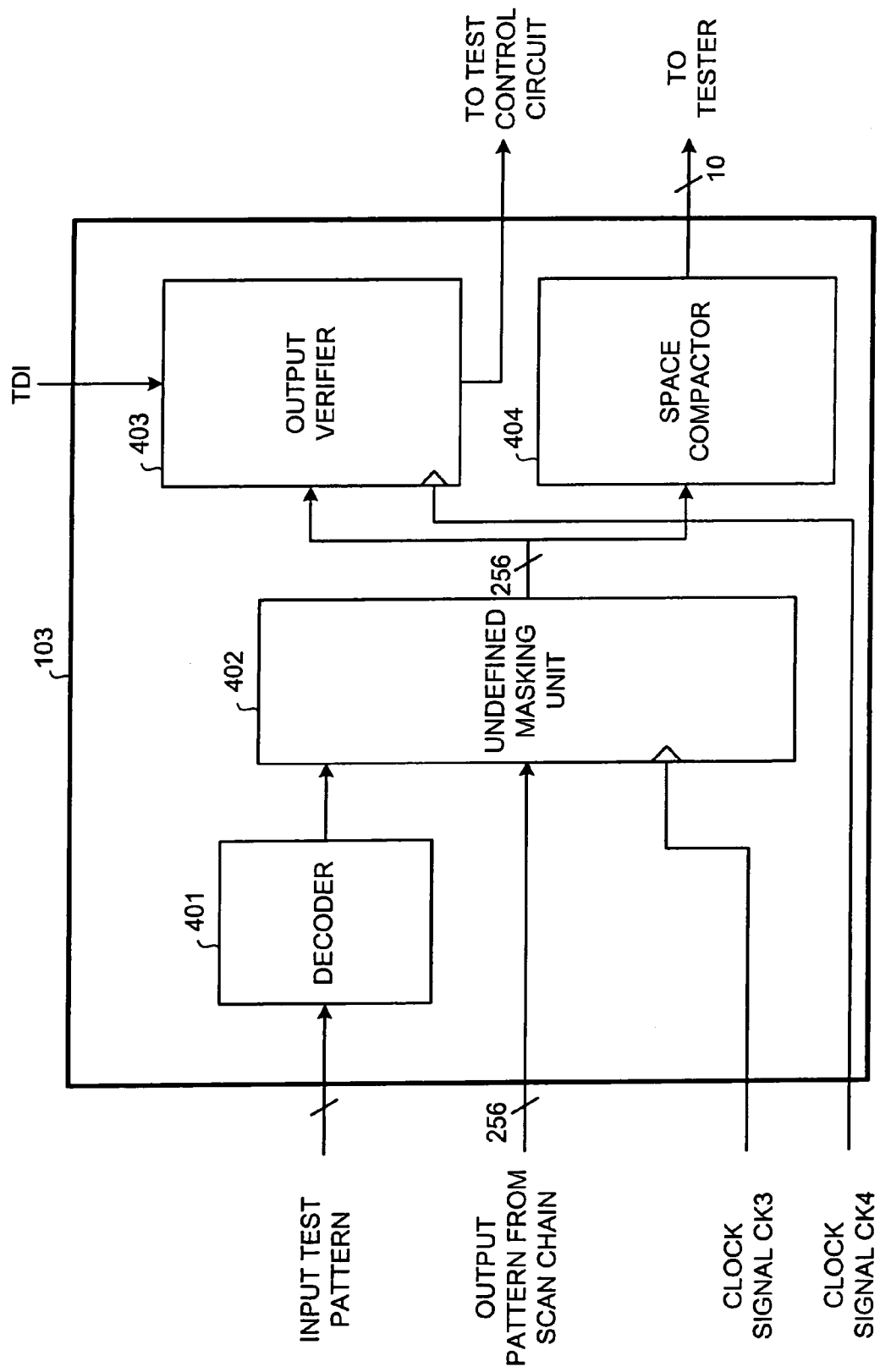
FIG. 4 is a block diagram of an output-side test circuit according to the embodiment.

FIG. 4 is a block diagram of the output-side test circuit 103. The output-side test circuit 103 is an output-side ATGBIST circuit. More specifically, the output-side test circuit 103 includes a decoder 401, the undefined masking unit 402, the output verifier 403, and a space compactor 404.

The decoder 401 decodes a test pattern output from the test pattern generator as explained later, and specifies a mask bit in the undefined masking unit 402 based on the result of decoding. The undefined masking unit 402 receives an output pattern from the scan chain C in synchronization with the clock signal CK3 for the undefined masking unit output from the clock generator 304, and masks the mask bit, of the output pattern, specified by the decoder 401.

The output verifier 403 is a Multiple Input Signature Register (MISR), and compresses an output pattern from the undefined masking unit 402 to a 1-bit signal and outputs the 1-bit signal to the test control circuit 105. For example, the output verifier 403 sequentially outputs a 256-bit output pattern from the undefined masking unit 402 to the test control circuit 105 one bit by one bit. The space compactor 404 includes an Exclusive OR (EOR) tree, compresses the output pattern from the undefined masking unit 402 to, for example, a 10-bit signal, and outputs the 10-bit signal to a tester (not shown).

Figure 5:
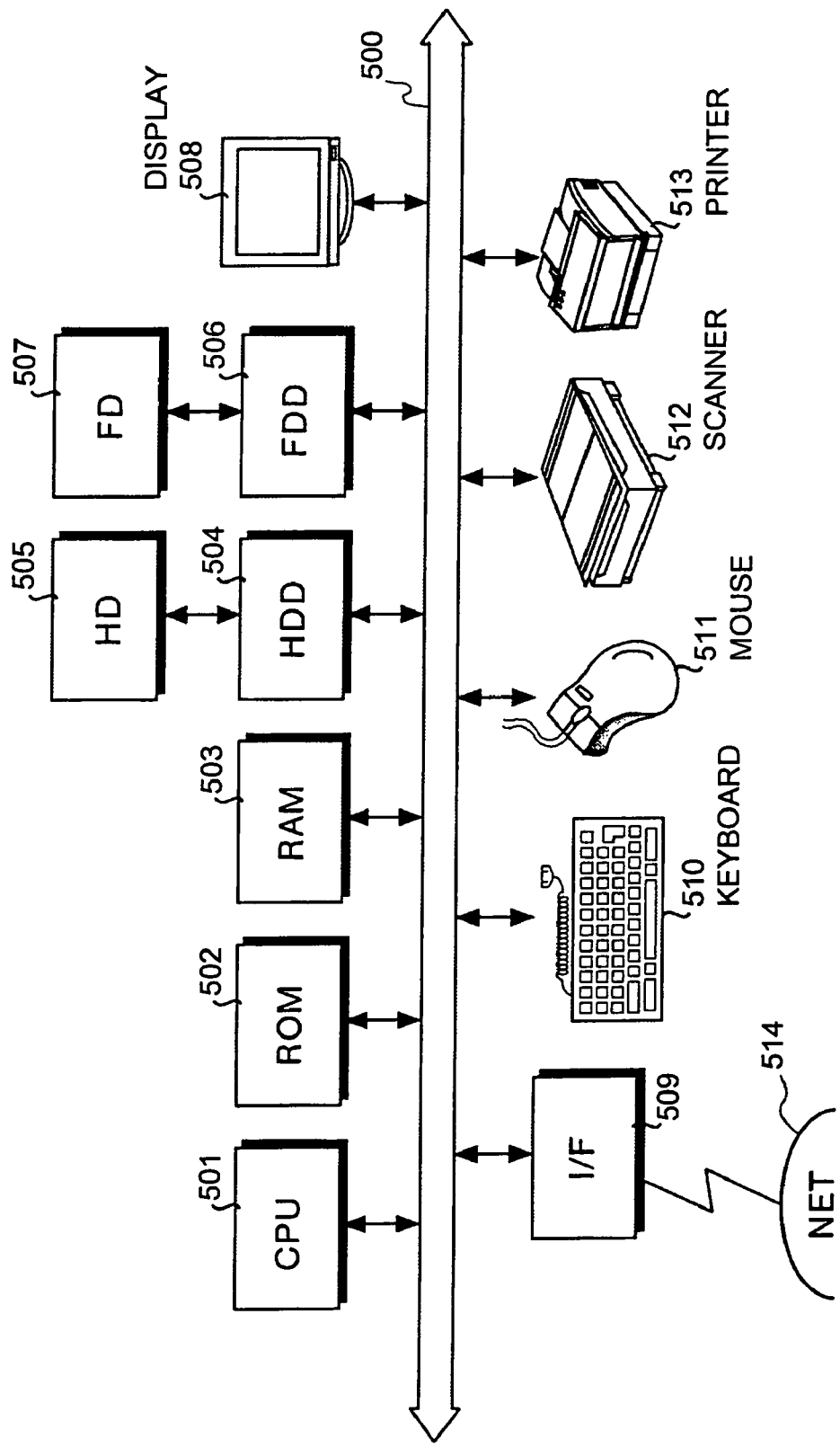
FIG. 5 is a block diagram of a hardware configuration of the test circuit tester according to the embodiment.

FIG. 5 is a block diagram of a hardware configuration of the test circuit tester 100.

As shown in FIG. 5, the test circuit tester 100 includes a central processing unit (CPU) 501, a read only memory (ROM) 502, a random access memory (RAM) 503, a hard disk drive (HDD) 504, a hard disk (HD) 505, a flexible disk drive (FDD) 506, a flexible disk (FD) 507 that is an example of a detachable recording medium, a display 508, an interface (I/F) 509, a keyboard 510, a mouse 511, a scanner 512, and a printer 513. These components communicate one another through a bus 500.

The CPU 501 controls the whole of the test circuit tester 100. The ROM 502 stores programs such as a boot program. The RAM 503 is used as a work area of the CPU 501. The HDD 504 controls read/write of data from/in the HD 505 under the control of the CPU 501. The HD 505 stores data written therein under the control of the HDD 504.

The FDD 506 controls read/write of data from/in the FD 507 under the control of the CPU 501. The FD 507 stores data written therein under the control of the FDD 506 or causes the test circuit tester 100 to read the data stored in the FD 507.

In addition to the FD 507, the detachable recording medium may include a Compact Disk-ROM (CD-ROM), a CD-Recordable (CD-R), a CD-Rewritable (CD-RW), a Magneto-Optical disk (MO), a Digital Versatile Disk (DVD), and a memory card. The display 508 displays a cursor, icons, a tool box, and data such as a text, an image, and function information. A Cathode Ray Tube (CRT), a Thin Film Transistor (TFT) liquid crystal display, or a plasma display may be used for the display 508.

The I/F 509 is connected to a network 514 such as the Internet through a communication line and is connected to other devices through the network 514. The I/F 509 serves as an interface between the network 514 and the internal components and controls input/output of data from/to an external device. A modem or a Local Area Network (LAN) adaptor may be used for the I/F 509.

The keyboard 510 includes keys used to enter characters, numerals, or various instructions, and data is entered through the keys. A touch panel type input pad and a ten-digit keypad may be provided. The mouse 511 is used to move the cursor and select a range, or to move a window and change its size. Alternatively, a track ball or a joy-stick may be used if it includes the same functions as a pointing device.

The scanner 512 optically scans an image and captures data for the image into the test circuit tester 100. An Optical Character Reader (OCR) function may be provided in the scanner 512. The printer 513 prints image data and document data. A laser printer or an ink jet printer may be used for the printer 513.

Figure 6:
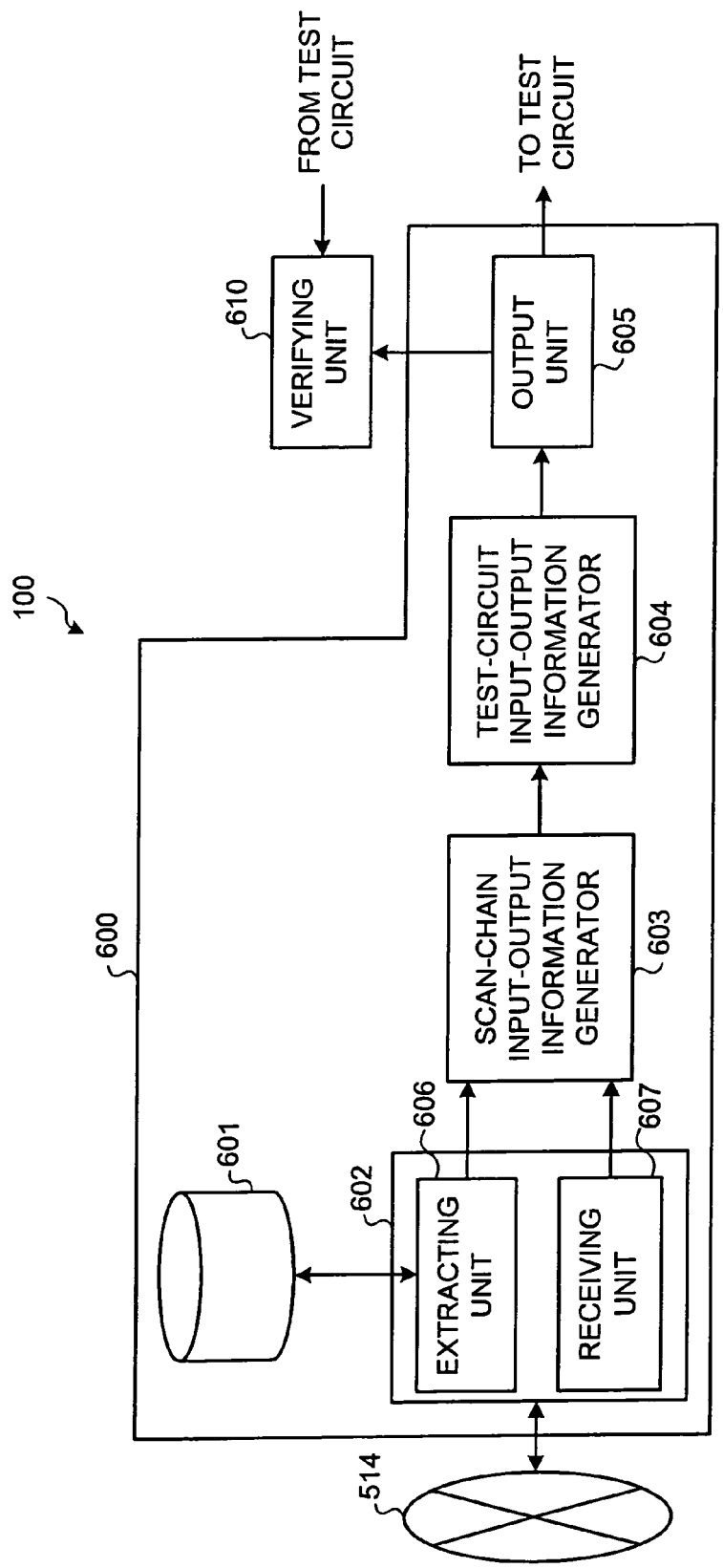
FIG. 6 is a functional block diagram of the test circuit tester according to the embodiment.

FIG. 6 is a functional block diagram of the test circuit tester 100 according to the embodiment. The test circuit tester 100 includes a test pattern generator 600 and a verifying unit 610.

The test pattern generator 600 includes a storage unit 601, an input unit 602, a scan-chain input-output information generator 603, a test-circuit input-output information generator 604, and an output unit 605. The storage unit 601 stores information for scan chains C in the target circuit 104. More specifically, the storage unit 601 stores the number of scan chains C and the number of stages (chain length) for each scan chain C in each target circuit 104.

The input unit 602 includes an extracting unit 606 and a receiving unit 607. The extracting unit 606 extracts information for a scan chain C in a target circuit 104 that is to be tested this time, from a set of information for the scan chains C stored in the storage unit 601. The receiving unit 607 receives the information for the scan chain C in the target circuit 104 from an external server over the network 514.

The scan-chain input-output information generator 603 generates information for input to and output from the scan chain C based on the information for the scan chain C input by the input unit 602. More specifically, the scan-chain input-output information generator 603 generates an internal input matrix that represents an input pattern that is input (scanned in) to the scan chain C, and an internal output matrix that represents an output pattern that is output (scanned out) from the scan chain C.

The test-circuit input-output information generator 604 generates information for input to and output from the test circuit based on the information for the input to and the output from the scan chain C generated by the scan-chain input-output information generator 603. More specifically, the test-circuit input-output information generator 604 generates an external input matrix that represents an input test pattern input to the input-side test circuit 102, and an external output matrix that represents an output test pattern for verifying an output pattern output from the output-side test circuit 103.

Figure 7:
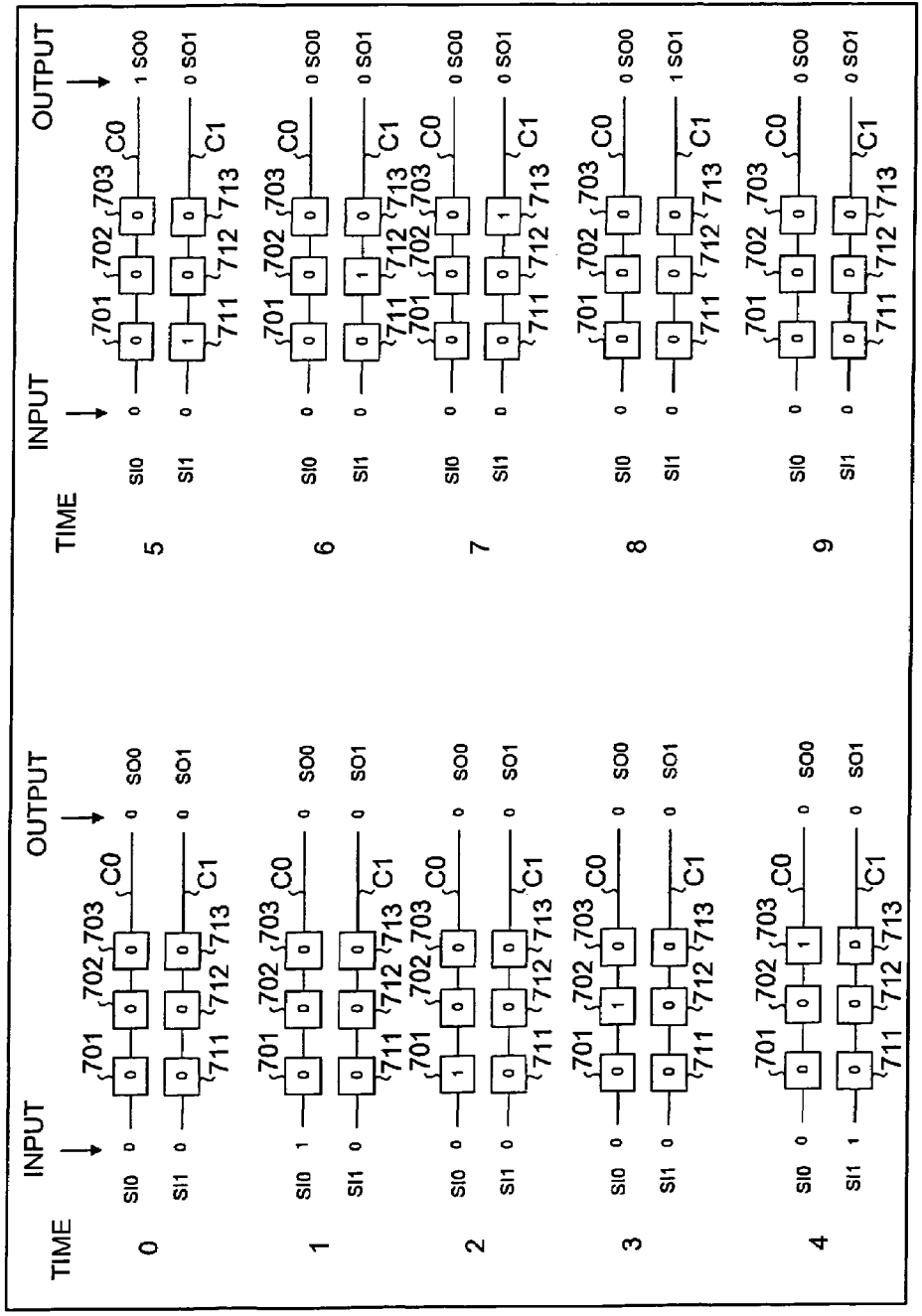
FIG. 7 is a schematic diagram for explaining internal states of scan FFs and values of signals input to scan chains, at each time.

The internal input matrix, the internal output matrix, the external input matrix, and the external output matrix are more specifically explained below. In the following explanation, the number of scan chains C is two, and the number of stages of each scan chain C is three for simplicity. FIG. 7 is a schematic diagram for explaining internal states of scan FFs and values of signals input to scan chains C at each time.

As shown in FIG. 7, time 0 represents an initial state, at which no signal is fed to input terminals SI0 and SI1. At time "1", a signal with value "1" is fed to the input terminal SI0 of the scan chain C0. At time "2", the signal with value 1 input to the input terminal SI0 shifts to a scan FF 701 in the first stage. At time "3", the signal with value 1 shifts to a scan FF 702 in the second stage. At time "4", the signal with value 1 shifts to a scan FF 703 in the third stage. At time "5", the signal with value 1 is output to the output terminal SO0.

On the other hand, at time "4", a signal with value 1 is fed to the input terminal SI1 of the scan chain C1. At time "5", the signal with value 1 input to the input terminal SI1 shifts to a scan FF 711 in the first stage. At time "6", the signal with value 1 shifts to a scan FF 712 in the second stage. At time "7", the signal with value 1 shifts to a scan FF 713 in the third stage. At time "8", the signal with value 1 is output to the output terminal SO1. At time "9", the input terminal SO1 is returned to the initial state.

FIG. 8 is a diagram of input-output matrices according to the embodiment. In the left column of FIG. 8, the internal input-output matrices are described. The internal input-output matrices express the internal states of the scan FFs as shown in FIG. 7. In the right column of FIG. 8, the external input-output matrices are described. In the right column, the values of signals at a test-circuit input terminal TDI are logical ORs of the values of signals input to the scan-chain input terminals. In other words, if the signal with value 1 is not input to both of the scan-chain input terminals, then "0" is input to the test-circuit input terminal TDI. If the signal with value 1 is input to at least either one of the scan-chain input terminals SI0 and SI1 then "1" is input to the test-circuit input terminal TDI.

A test-circuit input terminal XMASK is a flag indicating whether the undefined masking unit 402 is used. The value of a signal at a test-circuit input terminal SDI represents a terminal number of a scan-chain input terminal to which the signal with value 1 is input. In this case, two scan chains are provided, and therefore, the terminal number can be expressed by 1 bit. The value of the scan chain corresponding to the terminal number is reversed by the undefined masking unit 402.

The value of the signal at the test-circuit input terminal SDI is effective only when the value of the signal at the test-circuit input terminal TDI is "1". Therefore, at time "0", since the value of the signal at the test-circuit input terminal SDI is "0", the value of the 0-th scan chain is a target to be reversed. However, because the value of the signal at the test-circuit input terminal TDI is "0", the value of the 0-th scan chain is not reversed by the undefined masking unit 402.

On the other hand, at time "1", because the value of the signal at the test-circuit input terminal TDI is "1", the value of the 0-th scan chain is made reversed. The values of the test-circuit input terminals TDI, XMASK, and SDI form the external input matrix, i.e., input test patterns to be input to the test circuit.

A value of a test-circuit output terminal SDO is calculated by an Exclusive OR (EOR) of the scan-chain output terminals SO0 and SO1. The values of the test-circuit output terminal SDO form an external output matrix, i.e., output test patterns (expected values) of the test circuit.

As shown in FIG. 6, the output unit 605 outputs the information for the input to and the output from the test circuit generated by the test-circuit input-output information generator 604, as the input test pattern and the output test pattern. More specifically, the output unit 605 outputs the external input matrix, as the input test pattern, generated by the test-circuit input-output information generator to the input-side test circuit 102. On the other hand, the output unit 605 outputs the external output matrix, as the output test pattern, generated by the test-circuit input-output information generator 604 to the verifying unit 610.

The verifying unit 610 verifies the test circuit based on the output patterns output from the test circuit and the output test patterns output from the output unit 605. More specifically, the output patterns are output through the scan chains C after the input test patterns output from the output unit 605 are input to the test circuit. In other words, the verifying unit 610 compares output signals with the output test patterns. The output signals indicate the last output patterns output from the test circuit through the scan chains C, and are output from the output verifier 403. When they match each other, it is determined that no failure occurred, and it is determined that a failure occurred when they do not match. The verifying unit 610 may be included in the test control circuit 105.

The storage unit 601 realizes its functions by a rewritable recording medium such as the RAM 503, the HD 505, and the FD 507 as shown in FIG. 5. The input unit 602, the scan-chain input-output information generator 603, the test-circuit input-output information generator 604, the output unit 605, and the verifying unit 610 realize their functions by allowing the CPU 501 to execute the programs recorded in the ROM 502, the RAM 503, the HD 505, and FD 507 as shown in FIG. 5.

Examples of generating test patterns according to the embodiment of the present invention are explained below. At first, an example of generating a test pattern for verifying the operation of scan shifts.

In verification of a scan shift operation, external input is generated. The external input is such that "0" and "1" are alternately input to all the scan FFs included in the scan chains C. All the values input are checked by external output values (external output matrix) that the values are scanned out after they are shifted in the scan FFs. With these patterns, the operation of scan shifts and the operation of signal transition ($0 \to 1$, $1 \to 0$) can be checked. Furthermore, it is possible to detect whether any failure related to the shift operation of the scan chains C occurs.

Figure 9:
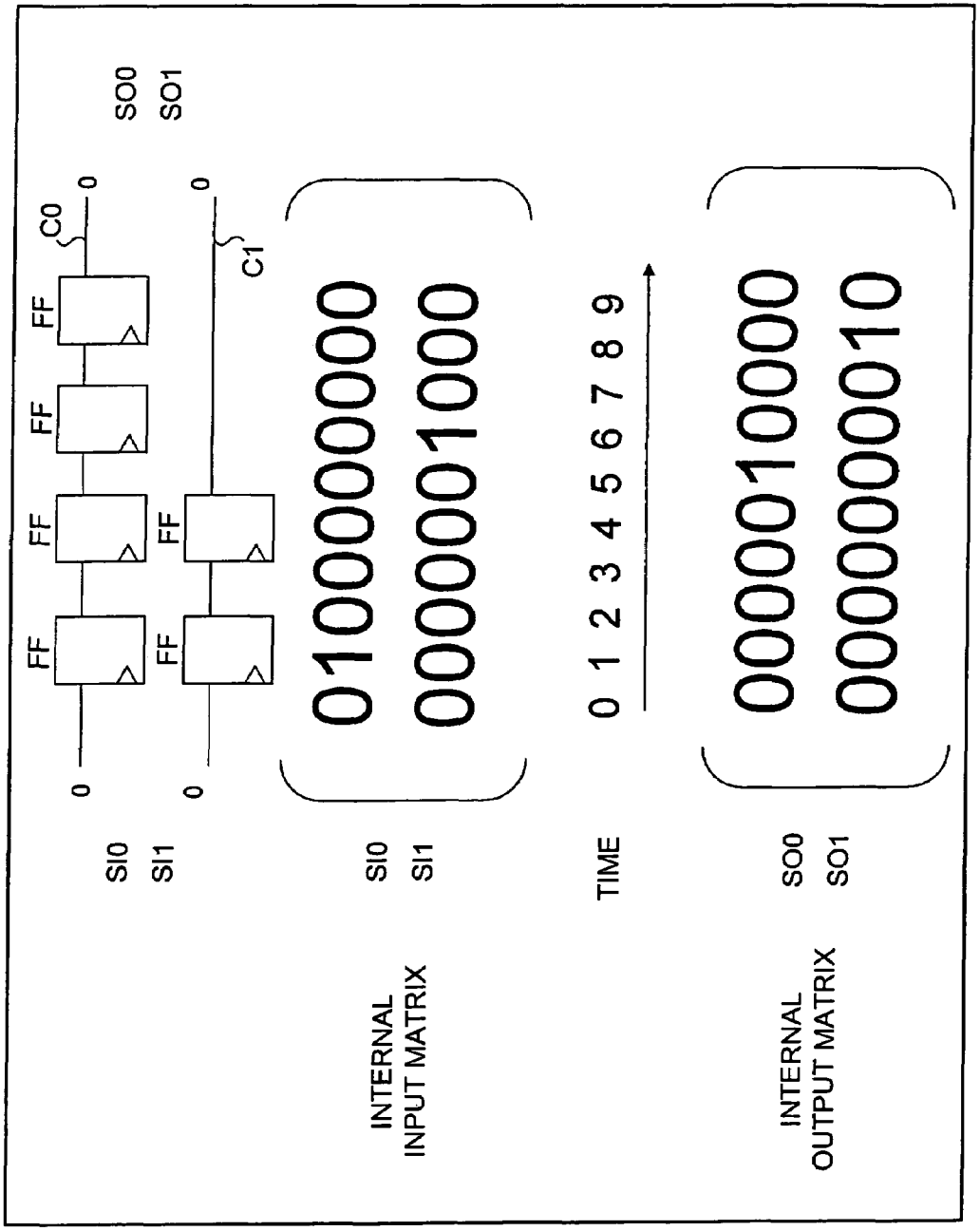
FIG. 9 is a schematic diagram for explaining an internal input matrix and an internal output matrix when the number of scan chains is two and the respective numbers of stages (chain length) are four and two.

In generation of the pattern for verifying the scan shift operation, at first, a matrix indicating an input to the scan chain C (internal input matrix) and a matrix indicating an output from the scan chain C (internal output matrix) are generated. FIG. 9 is a schematic diagram for explaining the internal input matrix and the internal output matrix when the number of scan chains is two and the respective numbers of stages (chain length) are four and two.

The internal input matrix and the internal output matrix are matrices each consisting of a row that represents a location (chain number) of a scan chain C and a column that represents a time at which an input is executed. The internal output matrix is formed intentionally so that even if signals are input in the same cycle (time), cycles to be shifted out are made different when chain lengths are different. Continuous shift operations are performed to verify the strictest timing in the scan shift operations for arrangement of input values. Therefore, the input values are arranged so that "1" does not appear in a plurality of locations in one scan shift operation.

Therefore, the internal input matrix is generated using the next technique. A list describing a chain length (stage) of each scan chain is created. The list is defined as "array subchain". The list is data already given, and therefore, it corresponds to scan chain information. Accordingly, the list is stored in the storage unit 601 or the external server.

Chain numbers (IDs) are sorted in the order from the longest scan chain based on the IDs indicating the locations of the scan chains C and the list "array subchain" to generate "array subchain_sort". The generation of the array subchain_sort allows easy detection of n-th longest scan chain and a chain length (stage) of the scan chain. Specific examples are shown below. FIG. 10 is a table containing "ID" and "Chain Length" according to the embodiment.

As shown in FIG. 10, the array subchain result in subchains (189, 45, 87, 90, and 10) in the ascending order of IDs. The chain lengths are provided on the right side.

subchain (0)=189
subchain (1)=45
subchain (2)=87
subchain (3)=90
subchain (4)=10

The array subchain_sort obtained by sorting the array subchain in the order from the longest chain length of the IDs results in subchain_sort (0, 3, 2, 1, and 4). The IDs are provided on the right side of the equations below.

subchain_sort (0)=0
subchain_sort (1)=3
subchain_sort (2)=2
subchain_sort (3)=1
subchain_sort (4)=4

Here, the definitions are given as follows:
j=subchain_sort (i)
k=subchain (j)
x=the maximum length of scan chains
z=the number of scan chains where i=0, 1, 2, 3, 4, . . . , and k is a chain length of an i-th longest scan chain.

The data scanned in at time Tin (Tin=$3 \times i + x - k + i$) is scanned out at time Tout (Tout=$3 \times i + x + i$). Concerning to "i", numbers of from i=0 to i=z−1 are substituted in the time Tin and the time Tout, the signal value 1 is put in coordinates (j, $3 \times i + x - k + i$) of the internal input matrix and coordinates (j, $3 \times i + x + i$) of the internal output matrix, and the signal value "0" is put in coordinates other than these two coordinates. It is thereby possible to generate internal input-output matrices in which "1" does not appear in the locations at the same time in the scan shift operation and a troubled location is easily specified from an expected value of the space compactor 404.

This is a technique of inversely calculating a time at which data is input so that the data is output at the time Tout. Based on the calculating formula, signals set in the internal output matrix are sequentially output like 0→1→0 from the scan chains without an unnecessary interval between the two. Furthermore, the scan chains are input in the order from the longest one so that corrected locations do not overlap. Internal input-output matrices generated in the scan chain configuration in this example are shown in FIG. 11.

Figure 11:
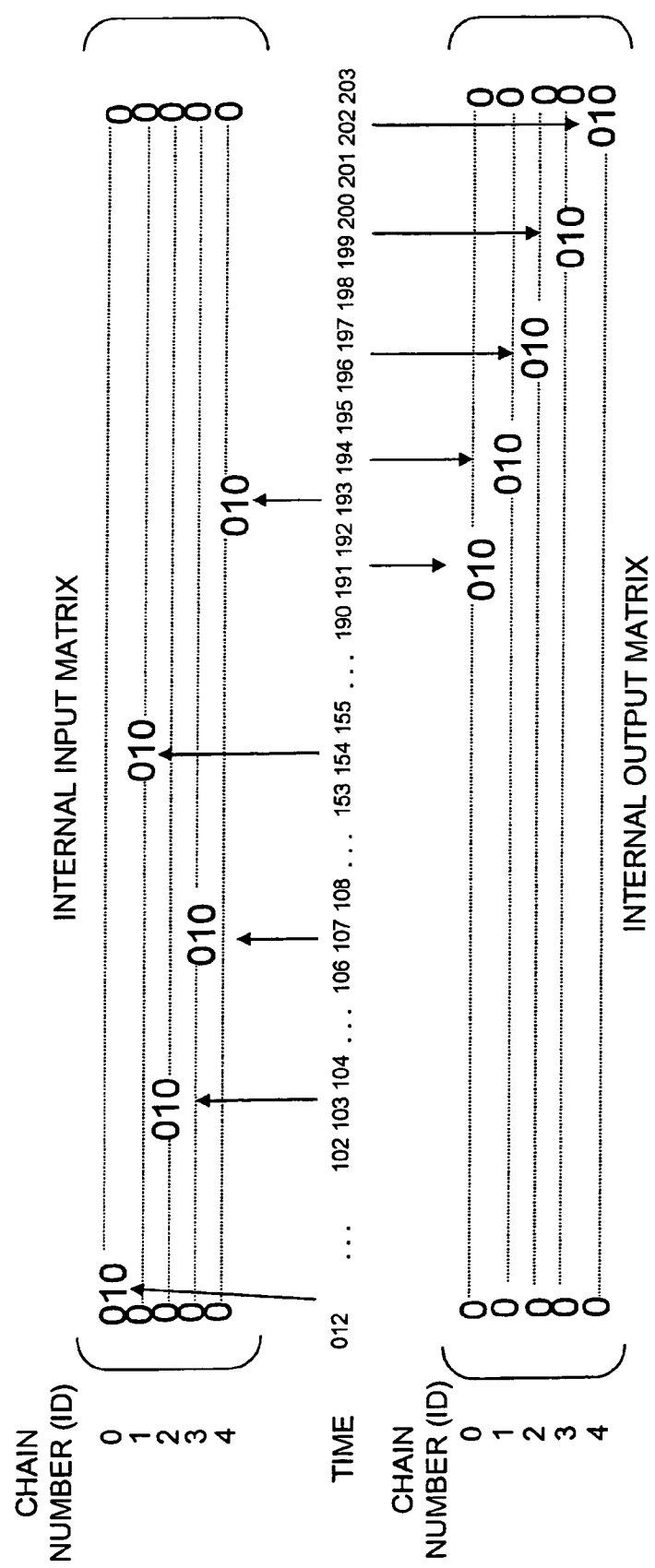
FIG. 11 is a schematic diagram for explaining an example of the internal input-output matrices generated in the scan chain configuration.

FIG. 11 is a schematic diagram for explaining an example of the internal input-output matrices generated in the scan chain configuration. External input-output matrices are generated based on the technique using the internal input-output matrices. With these matrices, an input test pattern and an output test pattern for testing a scan shift operation can be generated.

An example of generating a test pattern for testing operations of decoders 301 and 401 and for detecting a failure thereof is explained below. The test pattern for testing operations of decoders 301 and 401 and for detecting a failure thereof can cover all the statuses when the test pattern for the scan shift operation is to be input. Because "1" is input to all the scan chains C, it means that all types of test patterns are input to the decoders 301 and 401.

An example of generating a test pattern for testing operations of the space compactor 404 and for detecting a failure thereof is explained below. A failure of the space compactor 404 can be detected by the test pattern for verifying a scan shift operation. For example, an internal input-output matrices are generated so that outputs from the scan chains C are not "1" for the input of the space compactor 404 for arrangement of input values.

Figure 12:
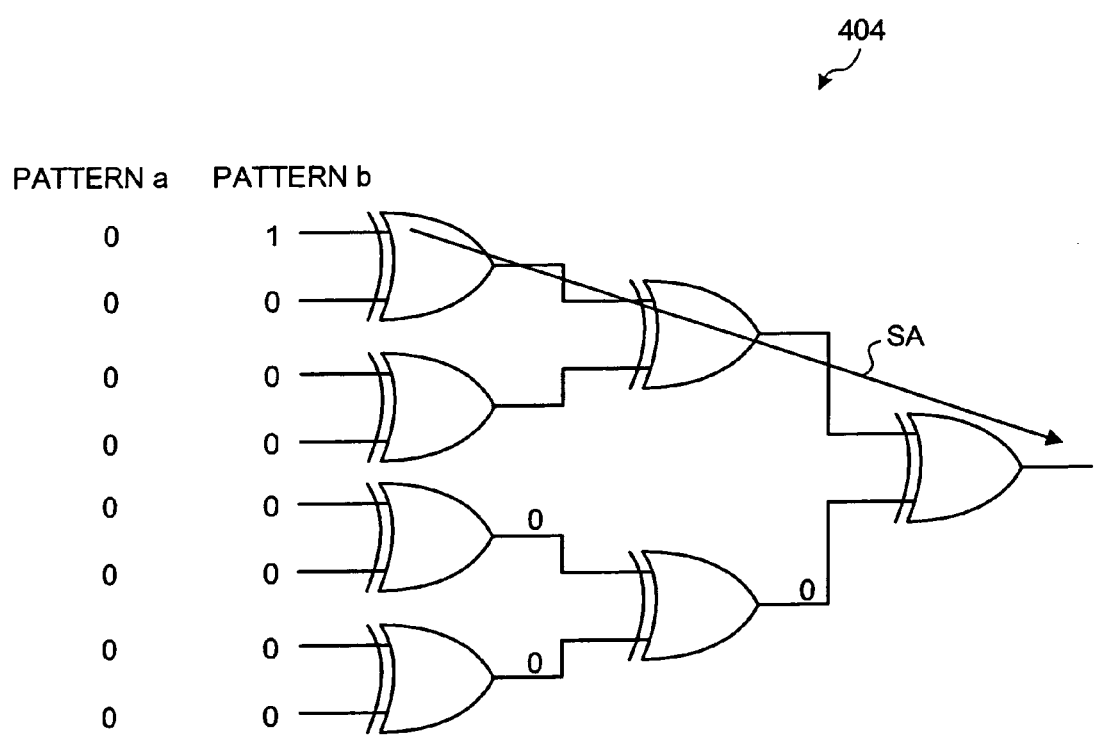
FIG. 12 is a hardware configuration of a space compactor.

FIG. 12 is a hardware configuration of the space compactor 404. The space compactor 404 is a circuit in which EOR gates are made to be a tree structure. When all the inputs to the space compactor 404 are "0", i.e., when the input pattern is a pattern a, all 1-degenerate failures of FIG. 12 can be detected.

When only one of the inputs to the space compactor 404 is "1", i.e., when the input pattern is a pattern b, 0-degenerate failure in a path indicated by an arrow SA of FIG. 12 can be detected. The space compactor 404 is input with a signal shifted out from the scan chain C. Since a pattern such that only the input of all the inputs is "1" is input, it is possible to detect failures of the almost all part of the space compactor 404.

As shown in the internal output matrix of FIG. 11, in internal output signals shifted out by the test pattern for the scan shift operation, there is no combination such that the scan chains C are "1" at the same time. Furthermore, signal transition of 0→1→0 occurs in all the signal conductors of the space compactor 404. Therefore, it is possible to verify timing from the space compactor 404 to the external output.

Figure 13:
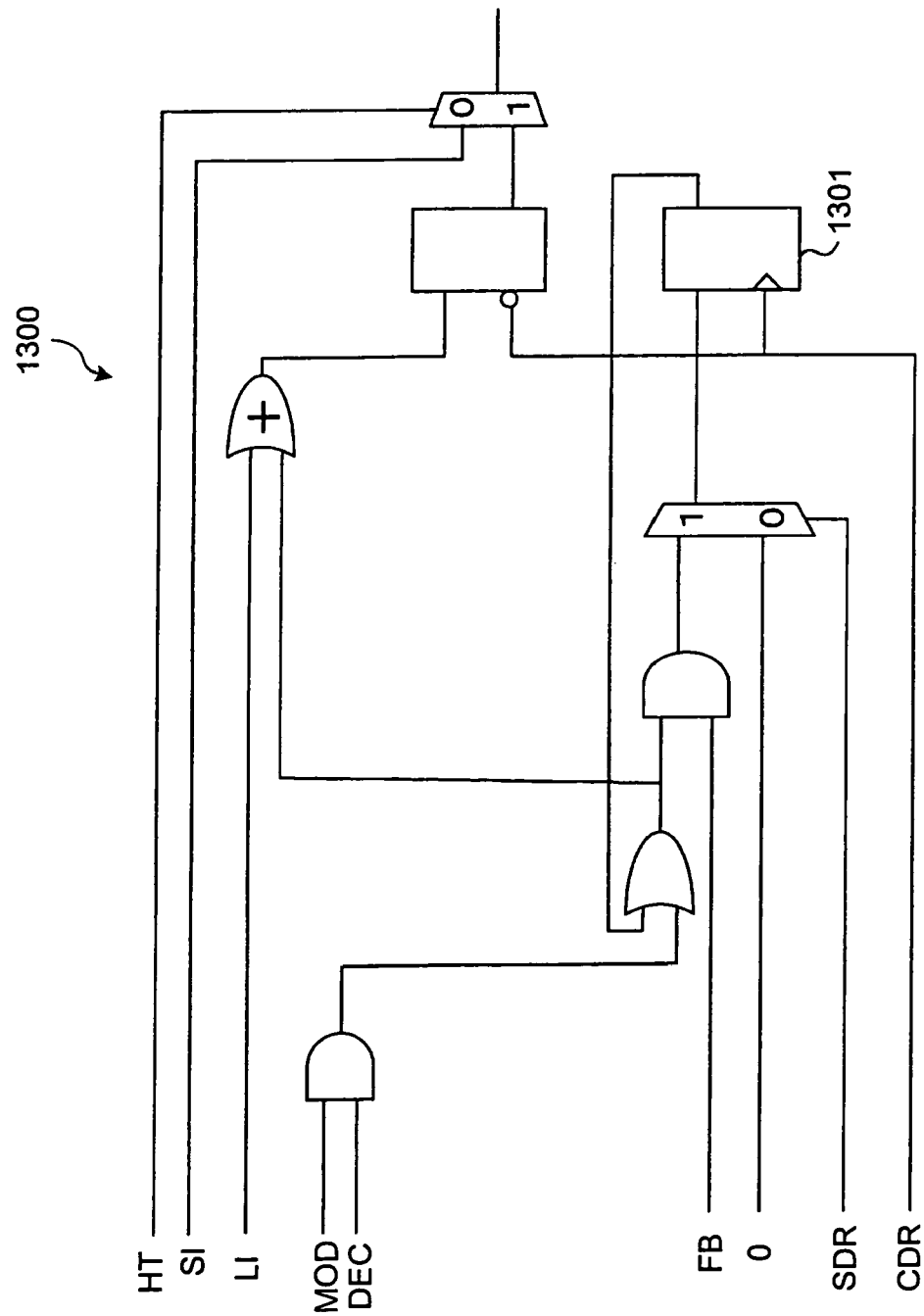
FIG. 13 to FIG. 15 are hardware configurations of an internal circuit for 1 bit in a pattern corrector.
Figure 14:
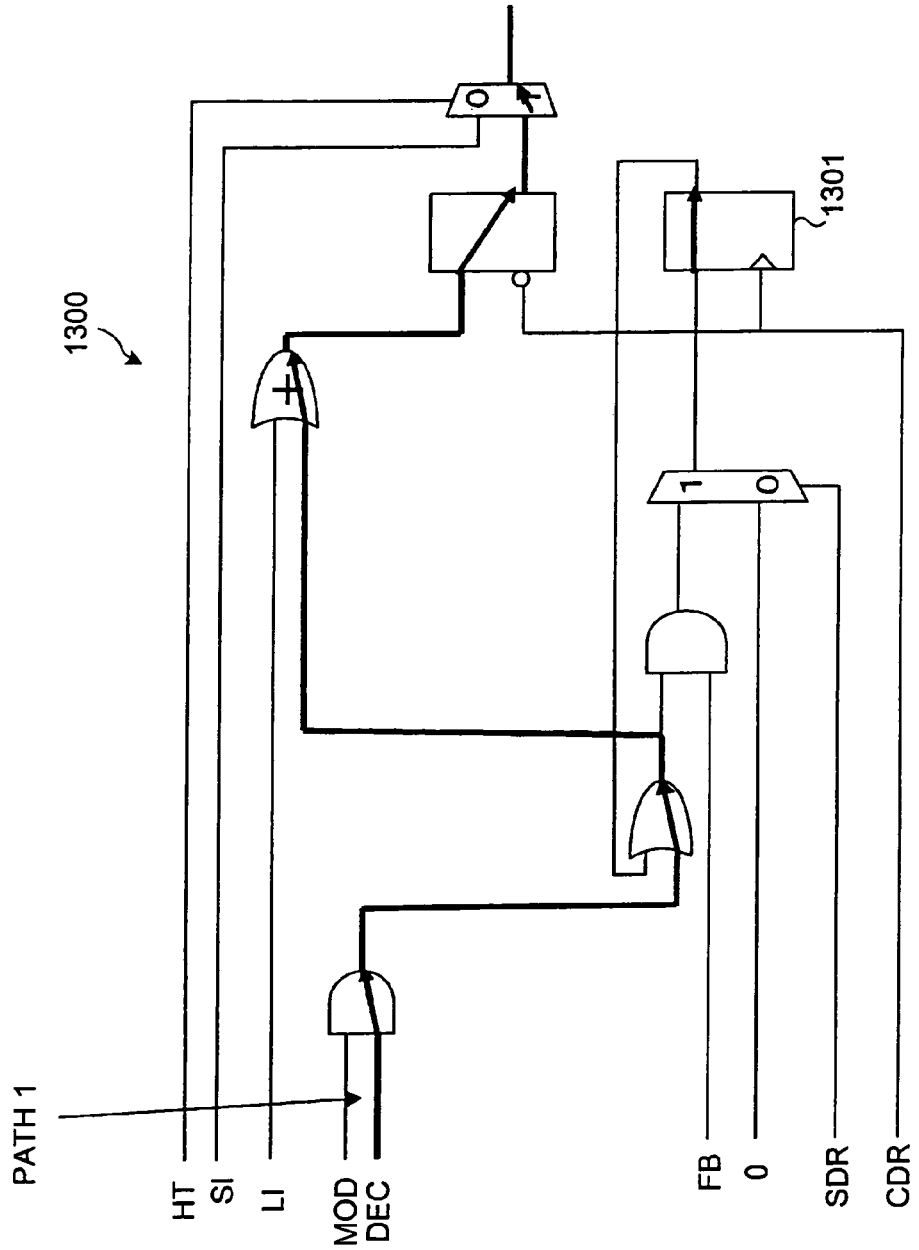
Figure 15:
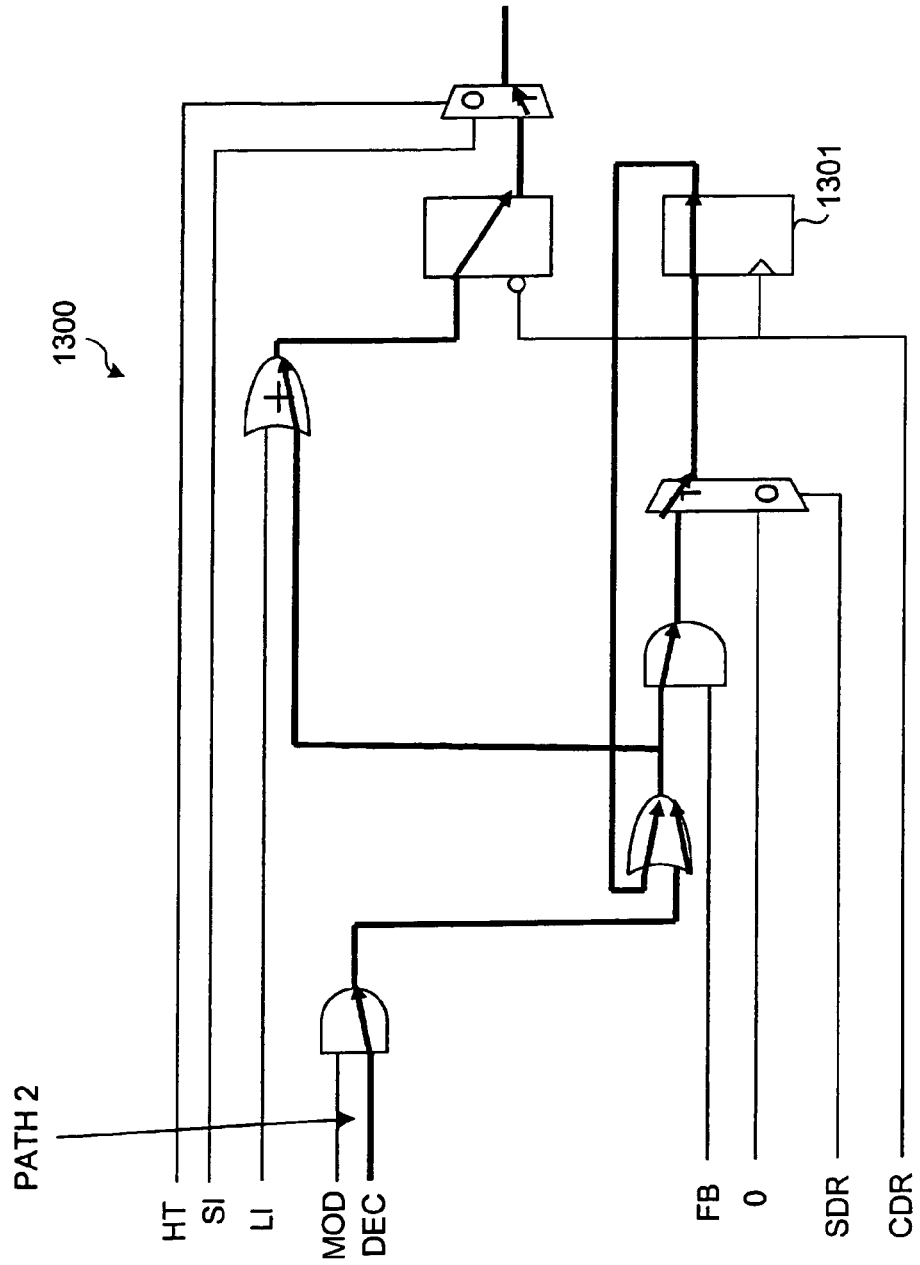

An example of generating a test pattern for verifying the pattern corrector 303 is explained below. FIG. 13 to FIG. 15 are hardware configurations of an internal circuit for one bit in the pattern corrector 303. An internal circuit 1300 for one bit includes an FF 1301 that holds information corrected. The main operations of the pattern corrector 303 have two cases. As shown in FIG. 14, one of the cases is to use a pattern input from the decoder 301 (DEC) (path 1 indicated by the heavy line and arrow of FIG. 14) on a path along which an input signal from the decoder 301 is propagated to a scan path, without using the FF 1301 provided inside the internal circuit. As shown in FIG. 15, the other case is to use a path along which a value of the input signal is stored in the FF 1301 and the input signal is propagated to the scan path (path 2 indicated by the heavy line and arrow of FIG. 15).

A test pattern is generated so as to cover these two operations by each internal circuit for each bit of the pattern corrector 303. The case of the path 1 as shown in FIG. 14 uses a test pattern that satisfies conditions the same as those in the test pattern for the scan shift operation, and therefore, the test pattern may not be generated. An example of verifying both the path 1 of FIG. 14 and the path 2 of FIG. 15 is shown below. More specifically, internal input-output matrices are generated in the following procedure.

The definitions are given as follows:
x=the maximum length of scan chains
z=the number of scan chains
j1=i
j2=(i+1)mod (z)
k1=subchain (j1)
k2=subchain (j2)

Subchains are an arrangement that describes the length of each scan chain C. The list of the subchains is the data already given and corresponds to the scan chain information. Therefore, the list is stored in the storage unit 601 or the external server.

Figure 16:
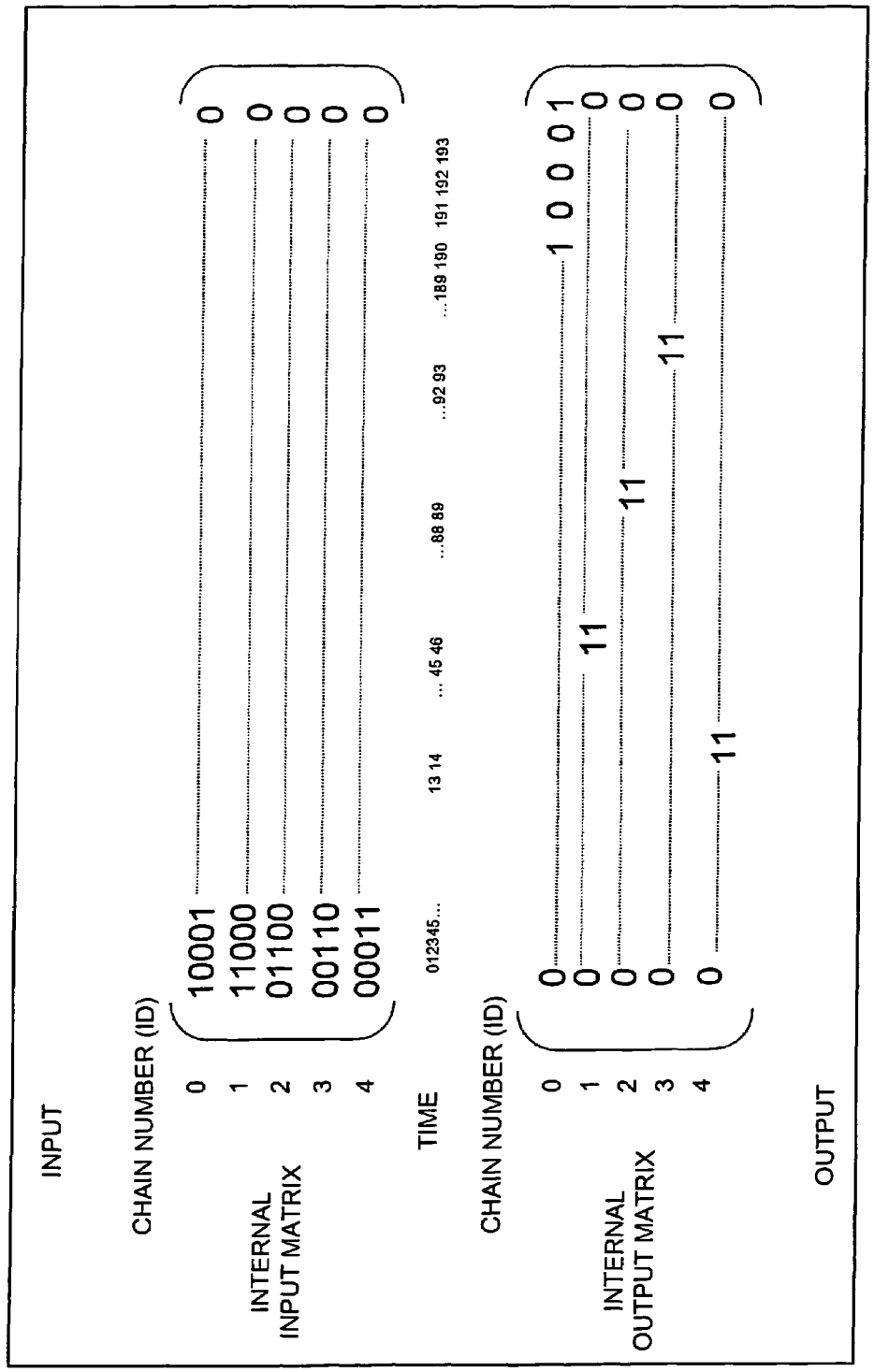
FIG. 16 is a schematic diagram for explaining internal input-output matrices for the pattern corrector.

Referring to the example in the table of FIG. 10, an internal matrix is generated by substituting numbers related to "1" ranging from i=0 to i=z−1 in the time Tin and the time Tout and putting the signal value 1 in coordinates (j1, i) and (j2, i) of the internal input matrix and coordinates (j1, i+k1) and (j2, i+k2) of the internal output matrix, and by putting the signal value "0" in coordinates other than the coordinates. The internal input-output matrices in this case are shown below. FIG. 16 is a schematic diagram for explaining the internal input-output matrices for the pattern corrector 303. In the matrices, values of location not specified are "0".

Figure 17:
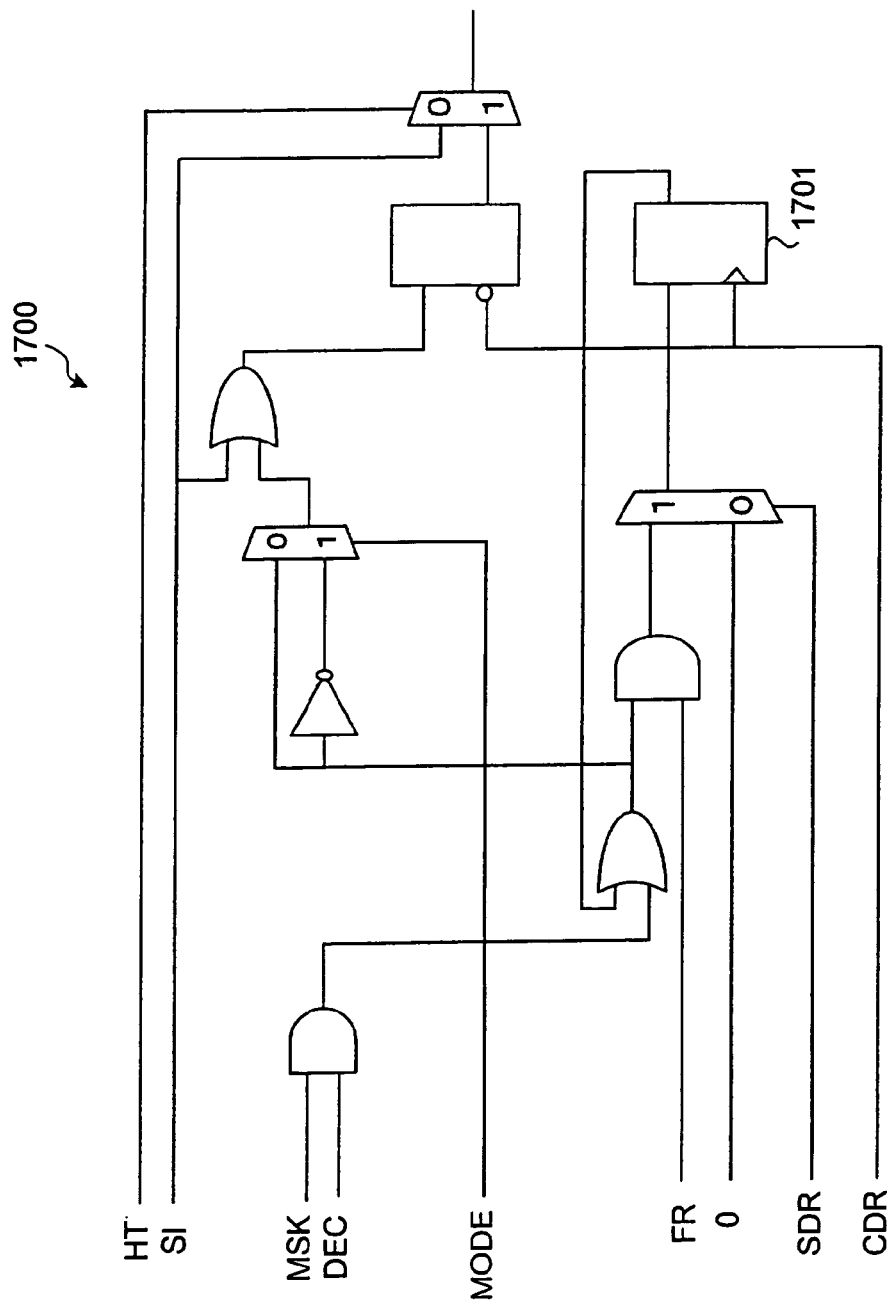
FIG. 17 to FIG. 19 are hardware configurations of an internal circuit for 1 bit in an undefined masking unit.
Figure 18:
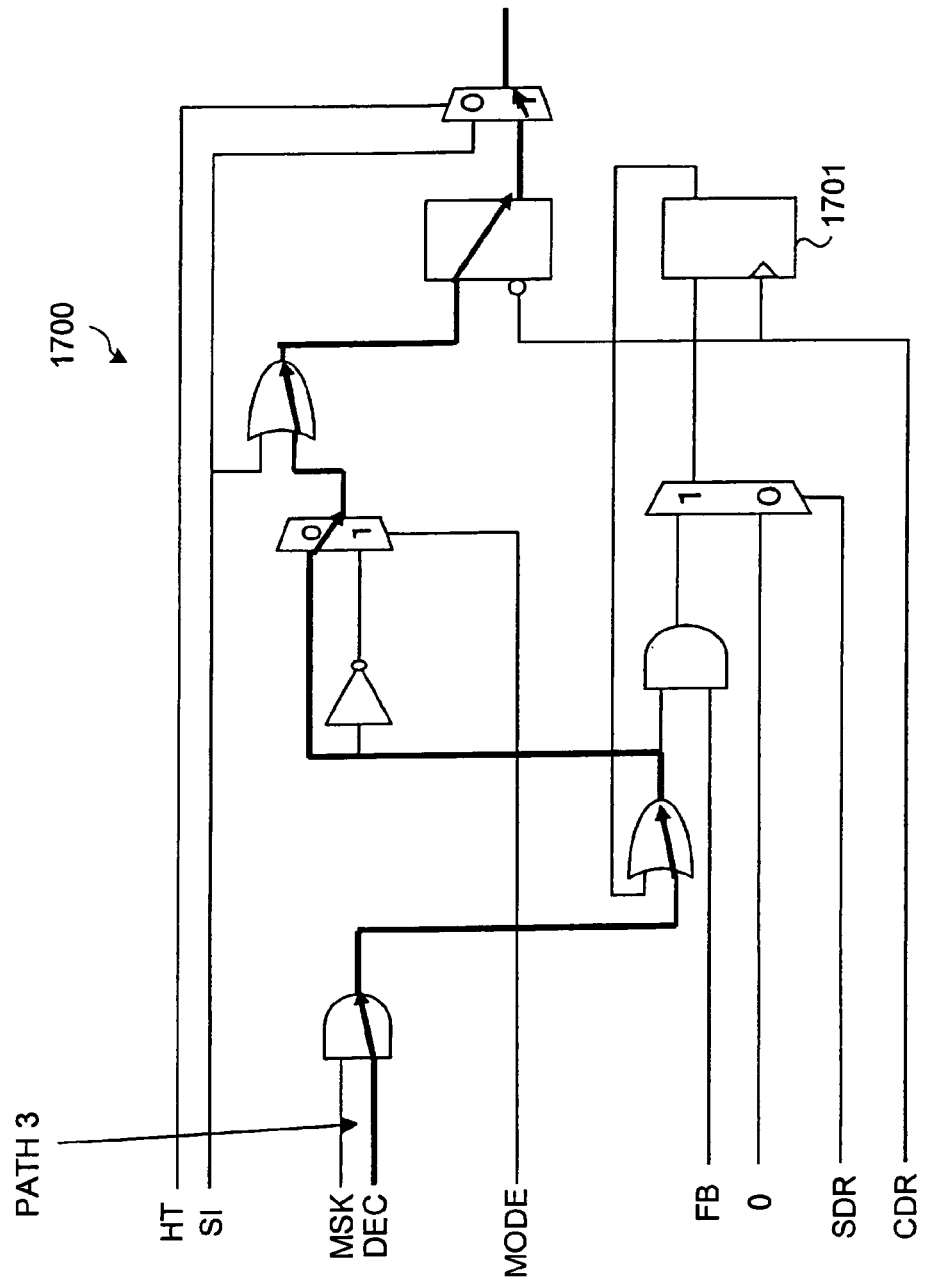
Figure 19:
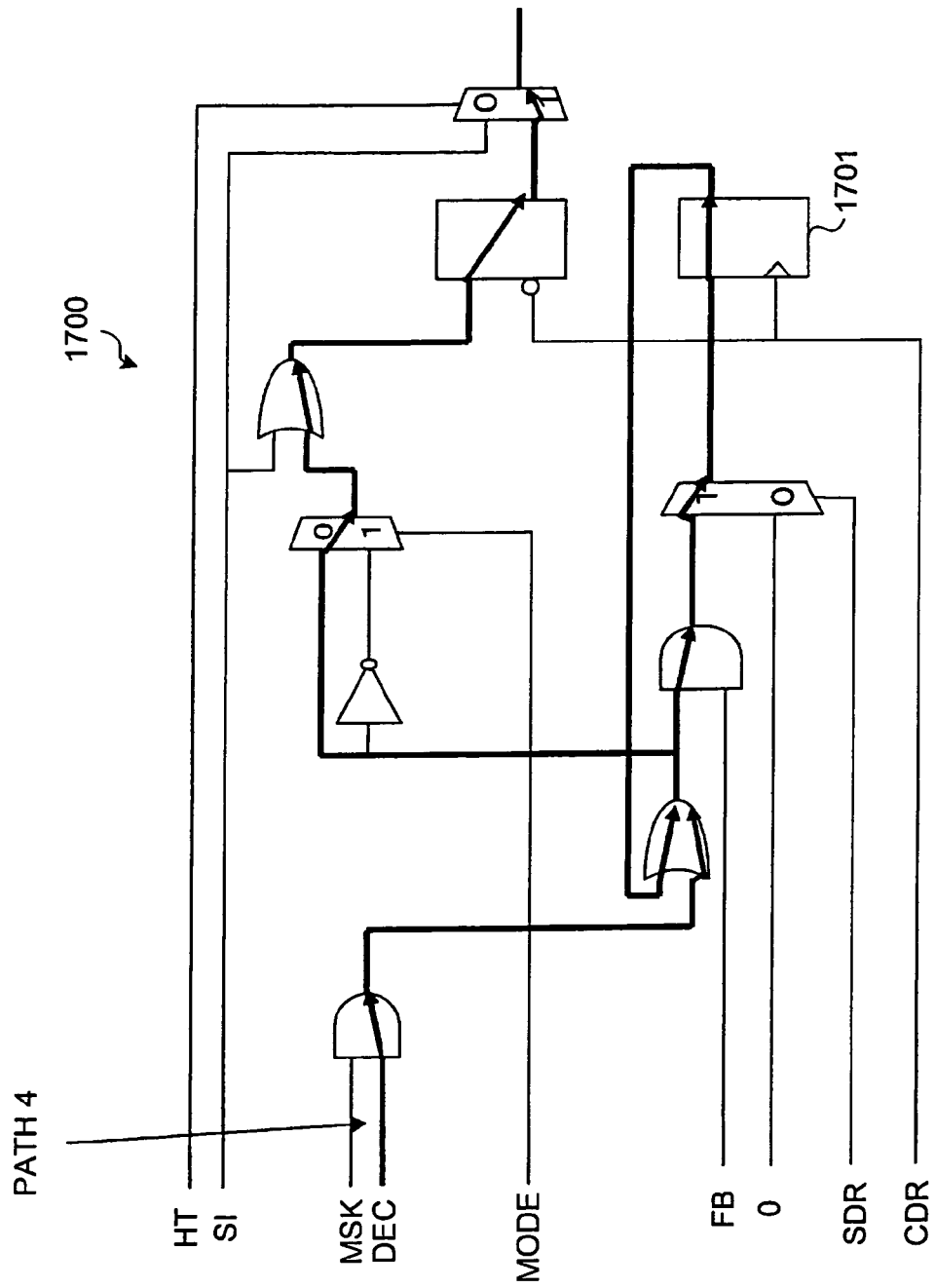

An example of generating a test pattern for testing an operation and detecting a failure of the undefined masking unit 402 is explained below. FIG. 17 to FIG. 19 are hardware configurations of an internal circuit 1700 for one bit in the undefined masking unit 402. The internal circuit 1700 includes an FF 1701 that holds mask information.

The main operations of the undefined masking unit 402 have two cases. As shown in FIG. 18, one of the cases is to use a pattern input from the decoder 401 (path 3 indicated by the heavy line and arrow of FIG. 18) without using the FF 1701 provided inside the internal circuit. As shown in FIG. 19, the other case is to use a path along which a value of input signal is stored in the FF 1701 and the input signal is propagated to the output verifier 403 (path 4 indicated by the heavy line and arrow of FIG. 19). A test pattern is generated so as to cover these two operations in each internal circuit for each bit in the undefined masking unit 402.

The technique explained below shows an example when the path 3 as shown in FIG. 18 operates in a scan chain C with the smallest chain number (ID) of the scan chains each in which "1" is set in a plurality of locations at the same time. The test pattern to be generated satisfies the conditions:

(1) The value "1" is set in two or more scan chains at the same time, and
(2) A plurality of test patterns is generated. The test patterns have the minimum chain number in which "1" is set in each of the scan chains C.

More specifically, internal input-output matrices are generated in the following procedure.

The definitions are given as follows:
x=the maximum length of scan chains
z=the number of scan chains
j1=i
j2=(i+1)mod (z)

An internal matrix is generated by substituting numbers ranging from i=0 to i=z−1 in the time Tin and the time Tout and putting the signal value 1 in coordinates (j1, i) and (j2, i) of the internal input matrix and coordinates (j1, i+k1) and (j2, i+k2) of the internal output matrix, and by putting the signal value "0" in coordinates other than the coordinates. The internal input-output matrices generated in the scan chain configuration are shown below. FIG. 20 is a schematic diagram for explaining the internal input-output matrices for the undefined masking unit 402. In the matrices, values of locations not specified are "0".

An example of generating a test pattern for testing an operation of the output verifier 403 is explained below. In the output verifier 403, a test pattern for verifying a scan shift operation, a test pattern for testing an operation of the decoder 301 and detecting a failure thereof, a test pattern for testing an operation of the space compactor 404 and detecting a failure thereof, a test pattern for verifying the pattern corrector 303, and a test pattern for testing an operation of the undefined masking unit 402 and detecting a failure thereof are operated, and then values of signals stored in the output verifier 403 are calculated. When a value calculated is shifted out to an external terminal, the value is set as an expected output value for the external terminal. The expected output value becomes an output test pattern.

Figure 21:
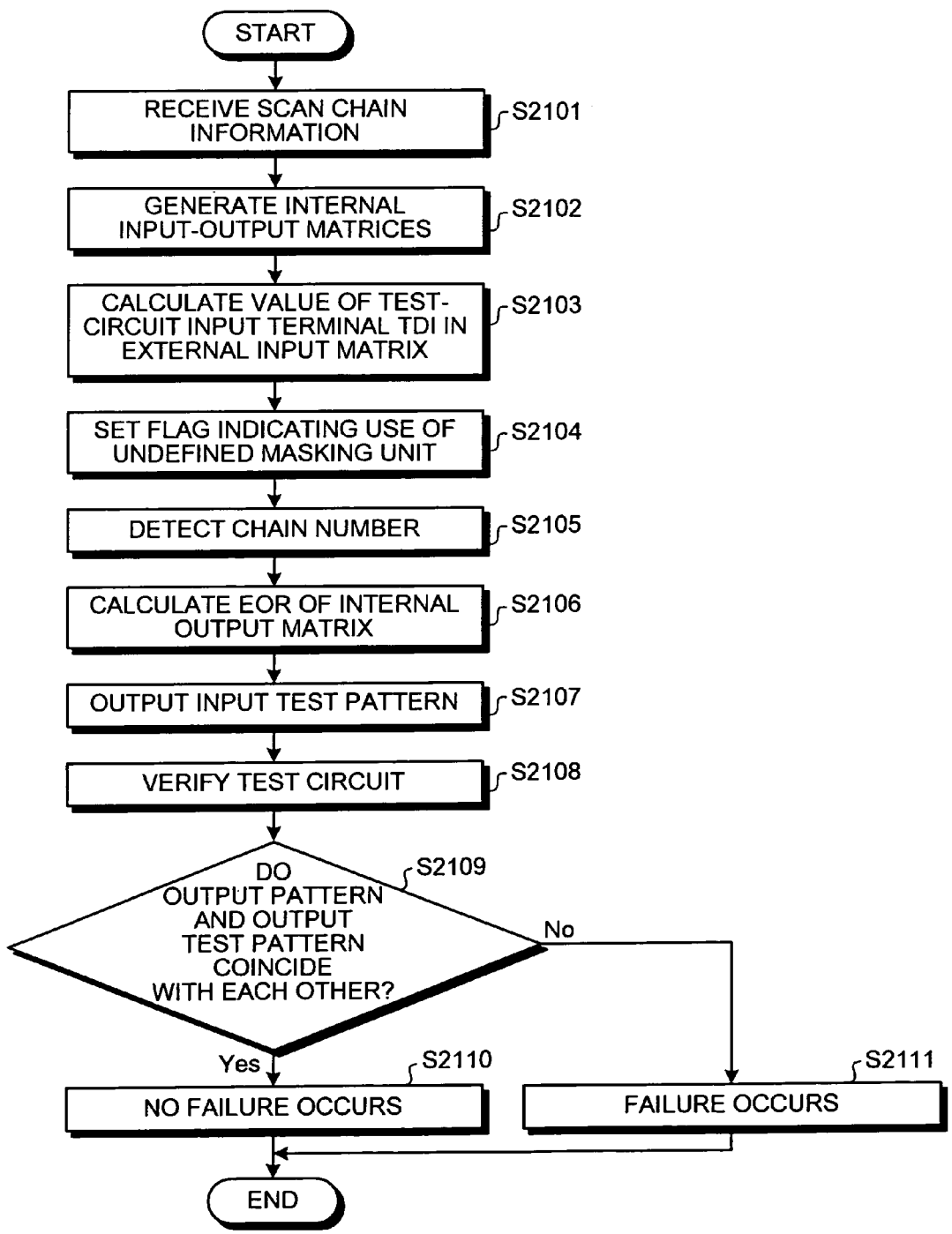
FIG. 21 is a flowchart of a process procedure of testing the test circuit according to the embodiment.

A process procedure of testing the test circuit according to the embodiment is explained below. FIG. 21 is a flowchart of the process procedure of testing the test circuit according to the embodiment. At first, scan chain information for the target circuit 104 is received (step S2101). An internal input-output matrices are generated from the scan chain information received using the technique (step S2102).

A value of the internal input matrix in each time, i.e., a logical OR of values of the scan-chain input terminals SI0 and SI1 as shown in FIG. 8 is calculated. Based on the calculation, a value of the test-circuit input terminal TDI in the external input matrix is calculated (step S2103). A flag indicating use of the undefined masking unit 402 is set (step S2104).

Furthermore, a chain number (ID) of a scan chain, of which scan-chain input terminals SI0 and SI1 are input with the signal with value 1, is detected (step S2105). These values form an external input matrix, i.e., an input test pattern. By calculating an EOR of the internal output matrix in each time, an external output matrix, i.e., an output test pattern that is an expected output value is generated (step S2106).

The input test pattern generated is time sequentially output to the test circuit (step S2107). In the test circuit, the input test pattern input to the input-side test circuit 102 is input to the output-side test circuit 103 through the scan chains, and an output pattern is output from the output verifier 403.

The test circuit is verified based on the output pattern and the output test pattern that is the expected output value (step S2108). In other words, if the output pattern and the output test pattern coincide with each other (step S2109: Yes), then it is determined that the test circuit operates normally, that is, no failure occurs therein (step S2110). On the other hand, if the output pattern and the output test pattern do not coincide with each other (step S2109: No), then it is determined that the test circuit operates abnormally, that is, a failure occurs therein (step S2111).

As explained above, according to the test circuit tester 100, generation of the test pattern for verifying the scan shift operation allows execution of high-speed simulation based on normal operation of scan shifts. Thus, it is possible to execute verification of the test pattern using simulation within a practical time, and to reduce the time required for testing.

Furthermore, it is possible to test the operations of and detect failures in the decoder 301, the space compactor 404, the pattern corrector 303, the undefined masking unit 402, and the output verifier 403 of the test circuit, which cannot be verified using the ATPG program based on the conventional technique. Therefore, reliability of testing is improved as compared with the case where the pattern generated by the ATPG is singly used.

As explained above, according to the test pattern generator 600, the test circuit tester 100, the test pattern generating method, the test circuit testing method, the test pattern generating program, the test circuit testing program, and the recording medium, detection of any failure in the test circuit allows reduction in testing time for the test circuit and improvement in reliability of testing performed on the target circuit 104.

The test pattern generating method or the test circuit testing method explained with reference to the embodiment of the present invention can be realized by allowing a computer such as a personal computer or a work station to execute the program pre-prepared. The program is recorded in a computer-readable recording medium such as a hard disk, a flexible disk, CD-ROM, MO, and DVD, and is executed by being read from the recording medium by the computer. Furthermore, the program may be a transmission medium capable of being distributed over a network such as the Internet.

According to the test pattern generator, the test circuit tester, the test pattern generating method, the test circuit testing method, the test pattern generating program, the test circuit testing program, and the recording medium of the present invention, it is advantageous that detection of any failure in the test circuit allows improvement in reliability of testing performed on a target circuit to be tested.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A test pattern generator in an integrated circuit, the integrated circuit including a plurality of scan chains and a test circuit that tests the scan chains, wherein the test pattern generator generates a test pattern for testing the test circuit, the test pattern generator comprising:
   an input unit that receives information for a scan chain;
   a scan-chain input-output information generator that generates information for an input and an output of the scan chain that is scan-chain input-output information, based on the information for the scan chain received;
   a test-circuit input-output information generator that generates information for an input and an output of the test circuit that is test-circuit input-output information, based on the scan-chain input-output information; and
   an output unit that outputs the test-circuit input-output information generated.

2. The test pattern generator according to claim 1, wherein the scan-chain input-output information generator includes
   a scan-chain input matrix generator that generates a scan-chain input matrix as the information for the input of the scan chain, the scan-chain input matrix time sequentially expressing scan-chain input patterns each of which is such that a test signal with value is input only to any one of the scan chains at a time; and a scan-chain output matrix generator that generates a scan-chain output matrix time sequentially expressing scan-chain output patterns that are output from the scan chains in response to the input of the scan-chain input patterns to the scan chains.

3. The test pattern generator according to claim 2, wherein the test-circuit input-output information generator includes a test-circuit input matrix generator that generates a test-circuit input matrix as the information for the input of the test circuit, the test-circuit input matrix time sequentially expressing test-circuit input patterns each of which includes a value of a logical OR of the scan-chain input patterns at each time and a value used to specify, at each time, a scan chain where the test signal with value is present; and a test-circuit output matrix generator that generates a test-circuit output matrix time sequentially expressing test-circuit output patterns each of which includes a value of an exclusive OR of the scan-chain output patterns at each time.

4. The test pattern generator according to claim 1, wherein the test-circuit input-output information includes an input test pattern and an output test pattern for operations of scan shifts of the scan chains.

5. The test pattern generator according to claim 1, wherein the test-circuit input-output information includes an input test pattern and an output test pattern for an operation of any one of a decoder, a pattern corrector, an undefined masking unit, an output verifier, and a space compactor, which are included in the test circuit.

6. A test circuit tester provided in an integrated circuit, the integrated circuit including a plurality of scan chains and a test circuit that tests the scan chains, wherein the test circuit tester tests the test circuit, the test circuit tester comprising:

an input unit that receives information for a scan chain;

a scan-chain input-output information generator that generates information for an input and an output of the scan chain that is scan-chain input-output information, based on the information for the scan chain received;

a test-circuit input-output information generator that generates information for an input and an output of the test circuit that is test-circuit input-output information, based on the scan-chain input-output information;

an output unit that outputs the test-circuit input-output information generated; and a verifying unit that verifies the test circuit based on an output pattern output from the test circuit through the scan chains in response to input of the information for the input of the test circuit output to the test circuit, and the information for the output from the test circuit.

7. A test pattern generating method to be employed in an integrated circuit, the integrated circuit including a plurality of scan chains and a test circuit that tests the scan chains, the test pattern generating method comprising:

generating a test pattern for testing the test circuit;
receiving information for a scan chain;
generating information for an input and an output of the scan chain that is scan-chain input-output information, based on the information for the scan chain received;
generating information for an input and an output of the test circuit that is test-circuit input-output information, based on the scan-chain input-output information; and
outputting the test-circuit input-output information generated, wherein the generating information for an input and an output of the scan chain includes generating a scan-chain input matrix as the information for the input of the scan chain, the scan-chain input matrix time sequentially expressing scan-chain input patterns each of which is such that a test signal with value is input only to any one of the scan chains at a time; and generating a scan-chain output matrix time sequentially expressing scan-chain output patterns that are output from the scan chains in response to the input of the scan-chain input patterns to the scan chains, and wherein the generating information for an input and an output of the test circuit includes generating a test-circuit input matrix as the information for the input of the test circuit, the test-circuit input matrix time sequentially expressing test-circuit input patterns each of which includes a value of a logical OR of the scan-chain input patterns at each time and a value used to specify, at each time, a scan chain where the test signal with value is present; and generating a test-circuit output matrix time sequentially expressing test-circuit output patterns each of which includes a value of an exclusive OR of the scan-chain output patterns at each time.

8. A test circuit testing method employed on an integrated circuit, the integrated circuit including a plurality of scan chains and a test circuit that tests the scan chains, the test circuit testing method comprising:

receiving information for a scan chain;
generating information for an input and an output of the scan chain that is scan-chain input-output information, based on the information for the scan chain received;
generating information for an input and an output of the test circuit that is test-circuit input-output information, based on the scan-chain input-output information; and
outputting the test-circuit input-output information generated, verifying the test circuit based on an output pattern output from the test circuit through the scan chains in response to input of the information for the input of the test circuit output to the test circuit, and the information for the output from the test circuit;

wherein the generating information for an input and an output of the scan chain includes generating a scan-chain input matrix as the information for the input of the scan chain, the scan-chain input matrix time sequentially expressing scan-chain input patterns each of which is such that a test signal with value is input only to any one of the scan chains at a time; and generating a scan-chain output matrix time sequentially expressing scan-chain output patterns that are output from the scan chains in response to the input of the scan-chain input patterns to the scan chains, and wherein the generating information for an input and an output of the test circuit includes generating a test-circuit input matrix as the information for the input of the test circuit, the test-circuit input matrix time sequentially expressing test-circuit input patterns each of which includes a value of a logical OR of the scan-chain input patterns at each time and a value used to specify, at each time, a scan chain where the test signal with value is present; and generating a test-circuit output matrix time sequentially expressing test-circuit output patterns each of which includes a value of an exclusive OR of the scan-chain output patterns at each time.

9. A computer-readable recording medium that has embodied or recorded on the medium a computer program for realizing on a computer a test pattern generating method to be employed in an integrated circuit, the integrated circuit including a plurality of scan chains and a test circuit that tests the scan chains, the computer program causing the computer to execute:
  generating a test pattern for testing the test circuit;
  receiving information for a scan chain;
  generating information for an input and an output of the scan chain that is scan-chain input-output information, based on the information for the scan chain received;
  generating information for an input and an output of the test circuit that is test-circuit input-output information, based on the scan-chain input-output information; and
  outputting the test-circuit input-output information generated,
  wherein the generating information for an input and an output of the scan chain includes
  generating a scan-chain input matrix as the information for the input of the scan chain, the scan-chain input matrix time sequentially expressing scan-chain input patterns each of which is such that a test signal with value is input only to any one of the scan chains at a time; and
  generating a scan-chain output matrix time sequentially expressing scan-chain output patterns that are output from the scan chains in response to the input of the scan-chain input patterns to the scan chains, and
  wherein the generating information for an input and an output of the test circuit includes
  generating a test-circuit input matrix as the information for the input of the test circuit, the test-circuit input matrix time sequentially expressing test-circuit input patterns each of which includes a value of a logical OR of the scan-chain input patterns at each time and a value used to specify, at each time, a scan chain where the test signal with value is present; and
  generating a test-circuit output matrix time sequentially expressing test-circuit output patterns each of which includes a value of an exclusive OR of the scan-chain output patterns at each time.

10. A computer-readable recording medium that has embodied or recorded on the medium a computer program for realizing on a computer a test circuit testing method employed on an integrated circuit, the integrated circuit including a plurality of scan chains and a test circuit that tests the scan chains, the computer program causing the computer to execute:
  receiving information for a scan chain;
  generating information for an input and an output of the scan chain that is scan-chain input-output information, based on the information for the scan chain received;
  generating information for an input and an output of the test circuit that is test-circuit input-output information, based on the scan-chain input-output information; and
  outputting the test-circuit input-output information generated,
  verifying the test circuit based on an output pattern output from the test circuit through the scan chains in response to input of the information for the input of the test circuit output to the test circuit, and the information for the output from the test circuit;
  wherein the generating information for an input and an output of the scan chain includes
  generating a scan-chain input matrix as the information for the input of the scan chain, the scan-chain input matrix time sequentially expressing scan-chain input patterns each of which is such that a test signal with value is input only to any one of the scan chains at a time; and
  generating a scan-chain output matrix time sequentially expressing scan-chain output patterns that are output from the scan chains in response to the input of the scan-chain input patterns to the scan chains, and
  wherein the generating information for an input and an output of the test circuit includes
  generating a test-circuit input matrix as the information for the input of the test circuit, the test-circuit input matrix time sequentially expressing test-circuit input patterns each of which includes a value of a logical OR of the scan-chain input patterns at each time and a value used to specify, at each time, a scan chain where the test signal with value is present; and
  generating a test-circuit output matrix time sequentially expressing test-circuit output patterns each of which includes a value of an exclusive OR of the scan-chain output patterns at each time.

* * * * *

UNITED STATES PATENT AND TRADEMARK OFFICE
CERTIFICATE OF CORRECTION

PATENT NO.        : 7,516,376 B2
APPLICATION NO.   : 10/968140
DATED             : April 7, 2009
INVENTOR(S)       : Osamu Okano et al.

Page 1 of 1

It is certified that error appears in the above-identified patent and that said Letters Patent is hereby corrected as shown below:

Title Page, Column 2 (Other Publications), Lines 3-4, change "Algorythm for Indentification" to --Algorithm for Identification--.

Signed and Sealed this

Eighteenth Day of August, 2009

David J. Kappos
*Director of the United States Patent and Trademark Office*